United States Patent
Yang et al.

(10) Patent No.: US 11,551,765 B2
(45) Date of Patent: Jan. 10, 2023

(54) NON-VOLATILE MEMORY WITH SPEED CONTROL

(71) Applicant: SANDISK TECHNOLOGIES LLC, Addison, TX (US)

(72) Inventors: Xiang Yang, Santa Clara, CA (US); Dengtao Zhao, Santa Clara, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 45 days.

(21) Appl. No.: 17/329,617

(22) Filed: May 25, 2021

(65) Prior Publication Data

US 2022/0383956 A1    Dec. 1, 2022

(51) Int. Cl.
G11C 11/34 (2006.01)
G11C 16/16 (2006.01)
G11C 16/26 (2006.01)
G11C 16/24 (2006.01)
G11C 16/32 (2006.01)
G11C 16/30 (2006.01)

(52) U.S. Cl.
CPC .............. G11C 16/16 (2013.01); G11C 16/24 (2013.01); G11C 16/26 (2013.01); G11C 16/30 (2013.01); G11C 16/32 (2013.01)

(58) Field of Classification Search
CPC ......... G11C 16/10; G11C 16/30; G11C 16/12; G11C 16/0483; H01L 27/115
USPC ........................................ 365/185.18, 185.29
See application file for complete search history.

(56) References Cited

U.S. PATENT DOCUMENTS

| | | |
|---|---|---|
| 7,495,954 B2 | 2/2009 | Ito |
| 8,824,211 B1 | 9/2014 | Costa |
| 8,885,420 B2 | 11/2014 | Oowada |
| 9,019,775 B2 | 4/2015 | Costa |
| 9,224,494 B2 | 12/2015 | Chin |
| 9,563,504 B2 | 2/2017 | Liang |
| 9,711,229 B1 | 7/2017 | Rabkin |
| 9,786,378 B1 | 10/2017 | Zhang |
| 10,304,551 B2 | 5/2019 | Ray |
| 10,741,253 B1 | 8/2020 | Lu |
| 2010/0002513 A1 | 1/2010 | Lutze |
| 2020/0303011 A1* | 9/2020 | Park ...................... G11C 16/12 |
| 2020/0402582 A1 | 12/2020 | Yang |
| 2020/0411122 A1* | 12/2020 | Song ................. H01L 27/11582 |
| 2021/0174887 A1 | 6/2021 | Sanada |

* cited by examiner

Primary Examiner — Son T Dinh
(74) Attorney, Agent, or Firm — Vierra Magen Marcus LLP

(57) ABSTRACT

A non-volatile memory system adjusts the speed of a memory operation for a subset of non-volatile memory cells. For example, during a GIDL based erase process, the GIDL generation can be dampened for a subset of memory cells (e.g., for a set of NAND strings, or one or more sub-blocks).

20 Claims, 24 Drawing Sheets

|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

NON-VOLATILE MEMORY WITH SPEED CONTROL

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). One example of non-volatile memory is flash memory (e.g., NAND-type and NOR-type flash memory).

Users of non-volatile memory can program (e.g., write) data to the non-volatile memory and later read that data back. For example, a digital camera may take a photograph and store the photograph in non-volatile memory. Later, a user of the digital camera may view the photograph by having the digital camera read the photograph from the non-volatile memory.

All or portions of the non-volatile memory can also be erased. For example, if data becomes stale or is no longer needed, the portion of the non-volatile memory storing the stale or no-longer-needed data can be erased so that the portion of the non-volatile memory can be available for storing new data. Alternatively, the erasing can be used to write data; for example, program from a first state to a second state and erase back to the first state (or between more than two states). The erase process used by the memory should be accurate so that data is not lost and should be fast enough so that users of the memory system do not experience an unreasonable delay.

BRIEF DESCRIPTION OF THE DRAWINGS

Like-numbered elements refer to common components in the different figures.

DETAILED DESCRIPTION

Figure 1:
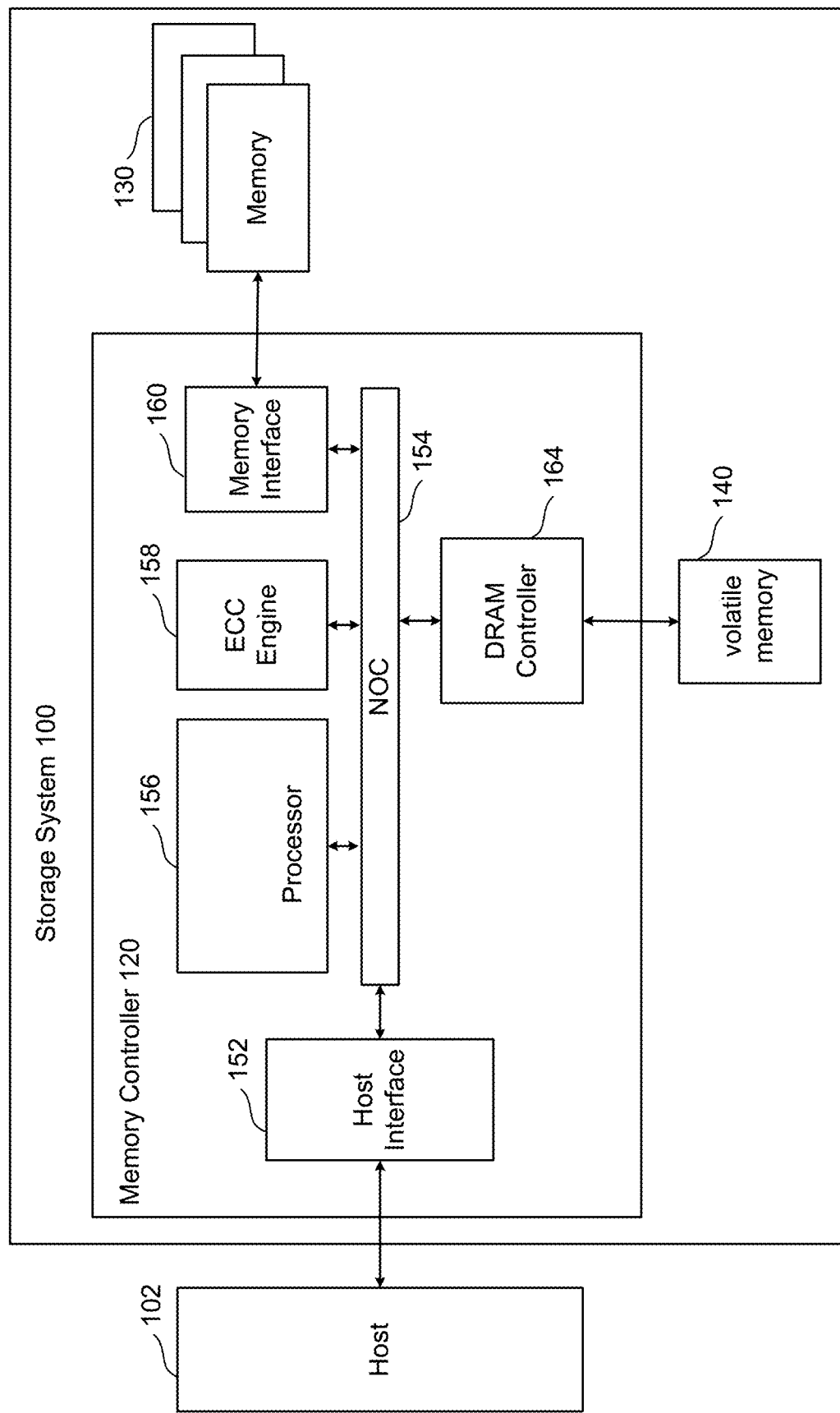
FIG. 1 is a block diagram depicting one embodiment of a storage system.

It has been observed that some memory cells erase faster than other memory cells. For example, in some memory systems that implement NAND strings and erase using gate induced drain leakage ("GIDL"), some NAND strings erase faster than other NAND strings. The faster NAND strings may become over erased which can result in endurance issues, a decrease in data retention and potential defects for the faster erasing NAND strings. To remedy the issue, it is proposed to reduce the erase speed of fast NAND strings (or other subsets of memory cells) by damping GIDL generation during a portion of the erase process. For example, a plurality of erase voltage pulses are applied to a first set of NAND strings and a second set NAND strings. During a particular erase voltage pulse, GIDL is generated for the first set of NAND strings for a first portion of the erase voltage pulse to cause the first set of NAND strings to experience erasing in response to the GIDL and the erase voltage pulse. The GIDL is dampened for the first set NAND strings for a second portion of the erase voltage pulse in order to dampen the erase operation for the first set of NAND strings. Additionally, GIDL is generated for the second set second set NAND strings to cause the second set of NAND strings to experience erasing in response to the GIDL and the erase voltage pulse.

This technology can be used for other memory operations that serve to change threshold voltage of memory cells, and can be used on structures other than NAND strings. One example embodiment comprises non-volatile memory connected to a control circuit. The non-volatile memory incudes a first group of non-volatile memory cells and a second group of non-volatile memory cells. The first group of non-volatile memory cells includes at least a first transistor to create GIDL for the first group of non-volatile memory cells. The second group of non-volatile memory cells includes at least a second transistor to create GIDL for the second group of non-volatile memory cells. The control circuit is configured to change threshold voltages of the first group of non-volatile memory cells and the second group of non-volatile memory cells by applying a dose of a memory operation voltage to the first group of non-volatile memory cells and the second group of non-volatile memory cells; applying a gate voltage to the first transistor to enable GIDL generation for the first group of non-volatile memory cells and applying a gate voltage to the second transistor to enable GIDL generation for the second group of non-volatile memory cells while applying the dose of the memory operation voltage to change threshold voltages of the first group of non-volatile memory cells and the second group of non-volatile memory cells; and after starting to apply the dose of the memory operation voltage and while still applying the dose of the memory operation voltage, changing the gate voltage to the first transistor to change GIDL generation for the first group of non-volatile memory cells.

FIG. 1 is a block diagram of one embodiment of a storage system 100 that implements the proposed technology described herein. In one embodiment, storage system 100 is a solid state drive ("SSD"). Storage system 100 can also be a memory card, USB drive or other type of storage system. The proposed technology is not limited to any one type of memory system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 connected to non-volatile memory 130 and local high speed volatile memory 140 (e.g., DRAM). Local high speed volatile memory 140 is used by memory controller 120 to perform certain functions. For example, local high speed volatile memory 140 stores logical to physical address translation tables ("L2P tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with non-volatile memory 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
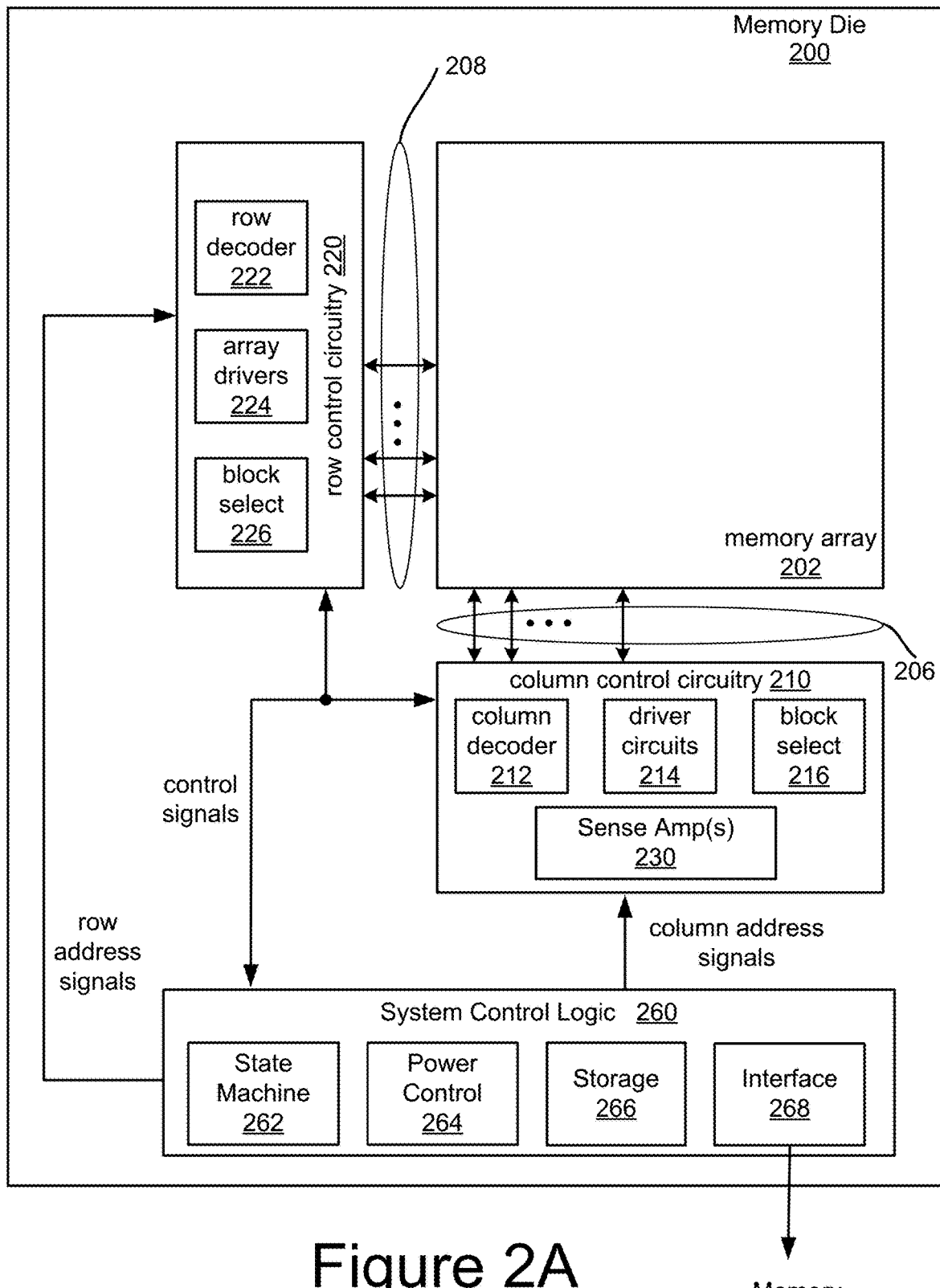
FIG. 2A is a block diagram of one embodiment of a memory die.

In one embodiment, non-volatile memory 130 comprises one or more memory die. FIG. 2A is a functional block diagram of one embodiment of a memory die 200 that comprises non-volatile memory 130. Each of the one or more memory die of non-volatile memory 130 can be implemented as memory die 200 of FIG. 2A. The components depicted in FIG. 2A are electrical circuits. Memory die 200 includes a memory array 202 that can comprises non-volatile memory cells, as described in more detail below. The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic circuit 206, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory array 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 262 can also include a power control module 264 that controls the power and voltages supplied to the rows and columns of the memory structure 202 during memory operations and may include charge pumps and regulator circuit for creating regulating voltages. System control logic 262 includes storage 366 (e.g., RAM, registers, latches, etc.), which may be used to store parameters for operating the memory array 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 360, can be formed as part of a single die. In other embodiments, some or all of the system control logic 260 can be formed on a different die.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 302 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 302 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
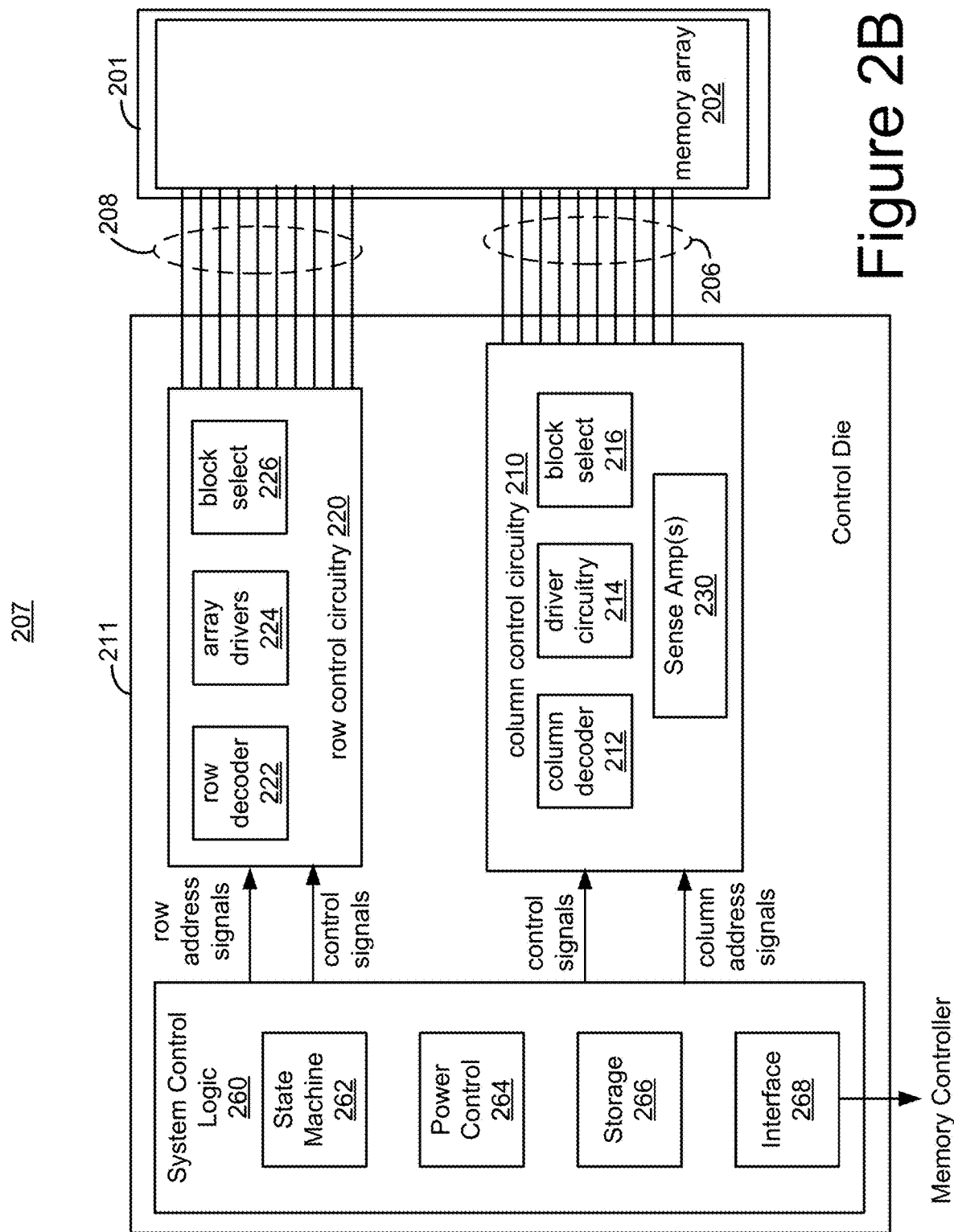
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile memory 130 of storage system 100. The integrated memory assembly 307 includes two types of semiconductor die (or more succinctly, "die"). Memory die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory die 201. In some embodiments, the memory die 201 and the control die 211 are bonded together.

FIG. 2B shows an example of the peripheral circuitry, including control circuits, formed in a peripheral circuit or control die 311 coupled to memory structure 202 formed in memory die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory die 201. In some embodiments, some of the circuitry in the system control logic 260 is located on the on the memory die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory 2 die 201 may reduce the number of steps needed to fabricate such a die, adding such circuits to a die such as control die 311 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory structure 202 on the memory die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory die 201, which are connected to bit lines of memory structure 202. Each bit line of memory structure 202 may have a corresponding electrical path in electrical paths 306, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory die 201.

For purposes of this document, the phrases "a control circuit" or "one or more control circuits" can include any one of or any combination of memory controller 120, state machine 262, all or a portion of system control logic 260, all or a portion of row control circuitry 220, all or a portion of column control circuitry 210, a microcontroller, a microprocessor, and/or other similar functioned circuits. The one or more control circuits can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 2C:
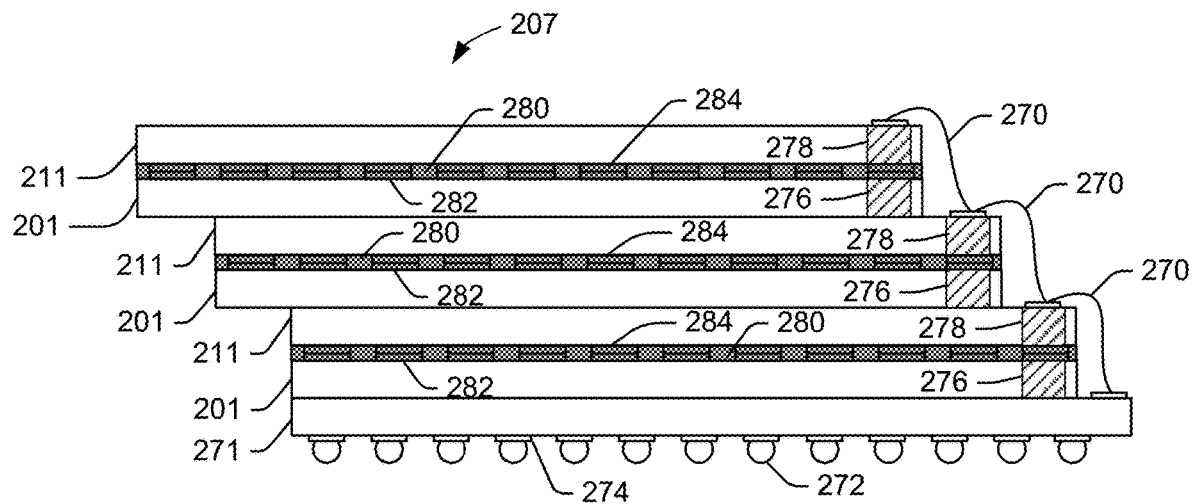
FIGS. 2C and 2D depict different embodiments of integrated memory assemblies.

In some embodiments, there is more than one control die 211 and more than one memory die 201 in an integrated memory assembly 207. In some embodiments, the integrated memory assembly 207 includes a stack of multiple control die 211 and multiple memory die 201. FIG. 2C depicts a side view of an embodiment of an integrated memory assembly 207 stacked on a substrate 271 (e.g., a stack comprising control dies 211 and memory dies 201). The integrated memory assembly 207 has three control dies 211 and three memory dies 201. In some embodiments, there are more than three memory dies 201 and more than three control die 211.

Each control die 211 is affixed (e.g., bonded) to at least one of the memory dies 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the dies 201, 211, and further secures the dies together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 2C).

A memory die through silicon via (TSV) 276 may be used to route signals through a memory die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 2D:
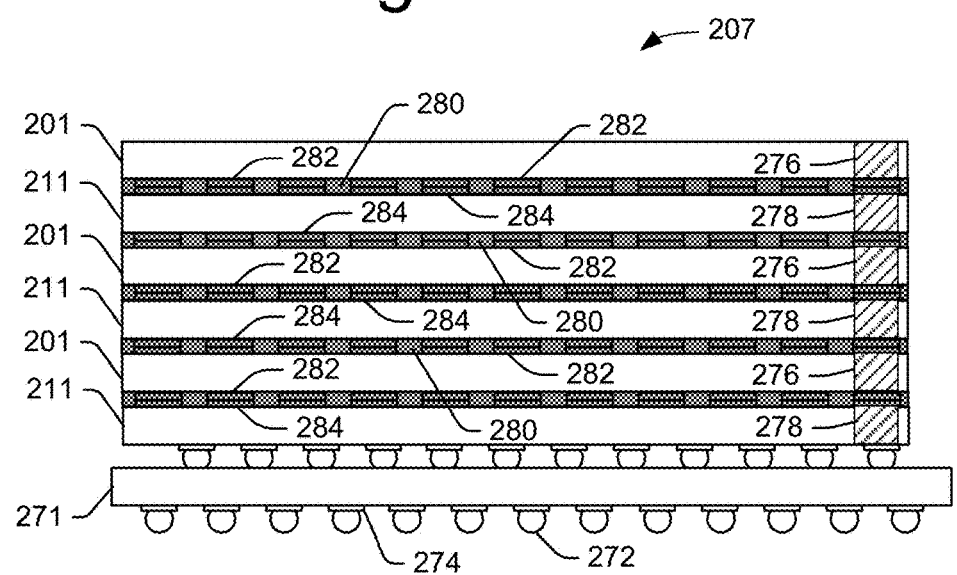

FIG. 2D depicts a side view of another embodiment of an integrated memory assembly 207 stacked on a substrate 271. The integrated memory assembly 206 of FIG. 2D has three control die 211 and three memory die 201. In some embodiments, there are many more than three memory dies 201 and many more than three control dies 211. In this example, each control die 211 is bonded to at least one memory die 201. Optionally, a control die 211 may be bonded to two or more memory die 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 2C, the integrated memory assembly 207 in FIG. 2D does not have a stepped offset. A memory die through silicon via (TSV) 276 may be used to route signals through a memory die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material, but in embodiments, it may be Hysol epoxy resin from Henkel Corp., having offices in California, USA.

Figure 3:
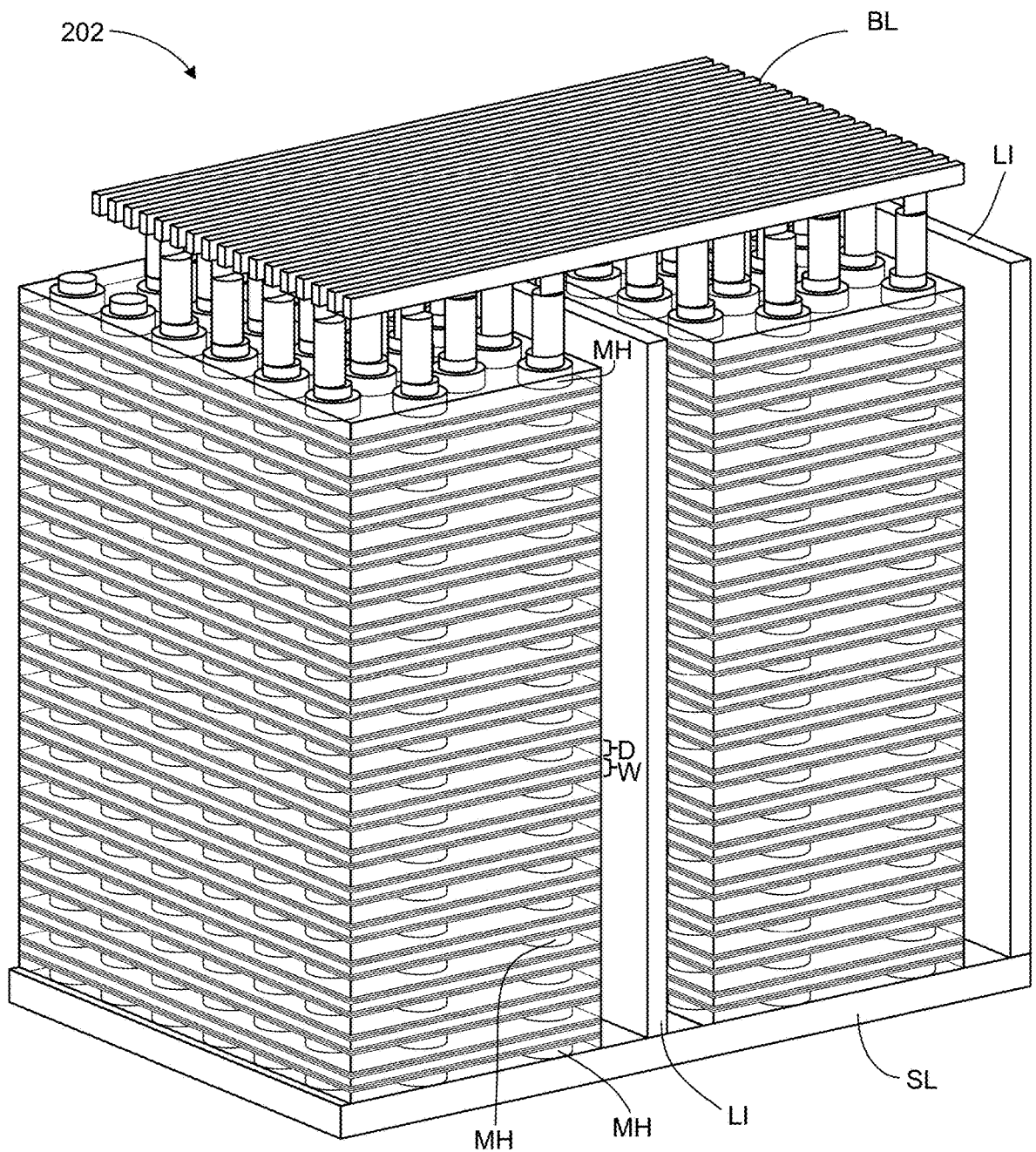
FIG. 3 is a perspective view of a portion of one embodiment of a monolithic three dimensional memory structure.

FIG. 3 is a perspective view of a portion of one example embodiment of a monolithic three dimensional memory array/structure that can comprise memory structure 202, which includes a plurality non-volatile memory cells arranged as vertical NAND strings. For example, FIG. 3 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-300 alternating dielectric layers and conductive layers. More or less than 108-300 layers can also be used. As will be explained below, in one embodiment the alternating dielectric layers and conductive layers are divided into four or more regions (e.g., sub-blocks) by local interconnects LI (optional). FIG. 3 shows two fingers and two local interconnects LI. Below the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
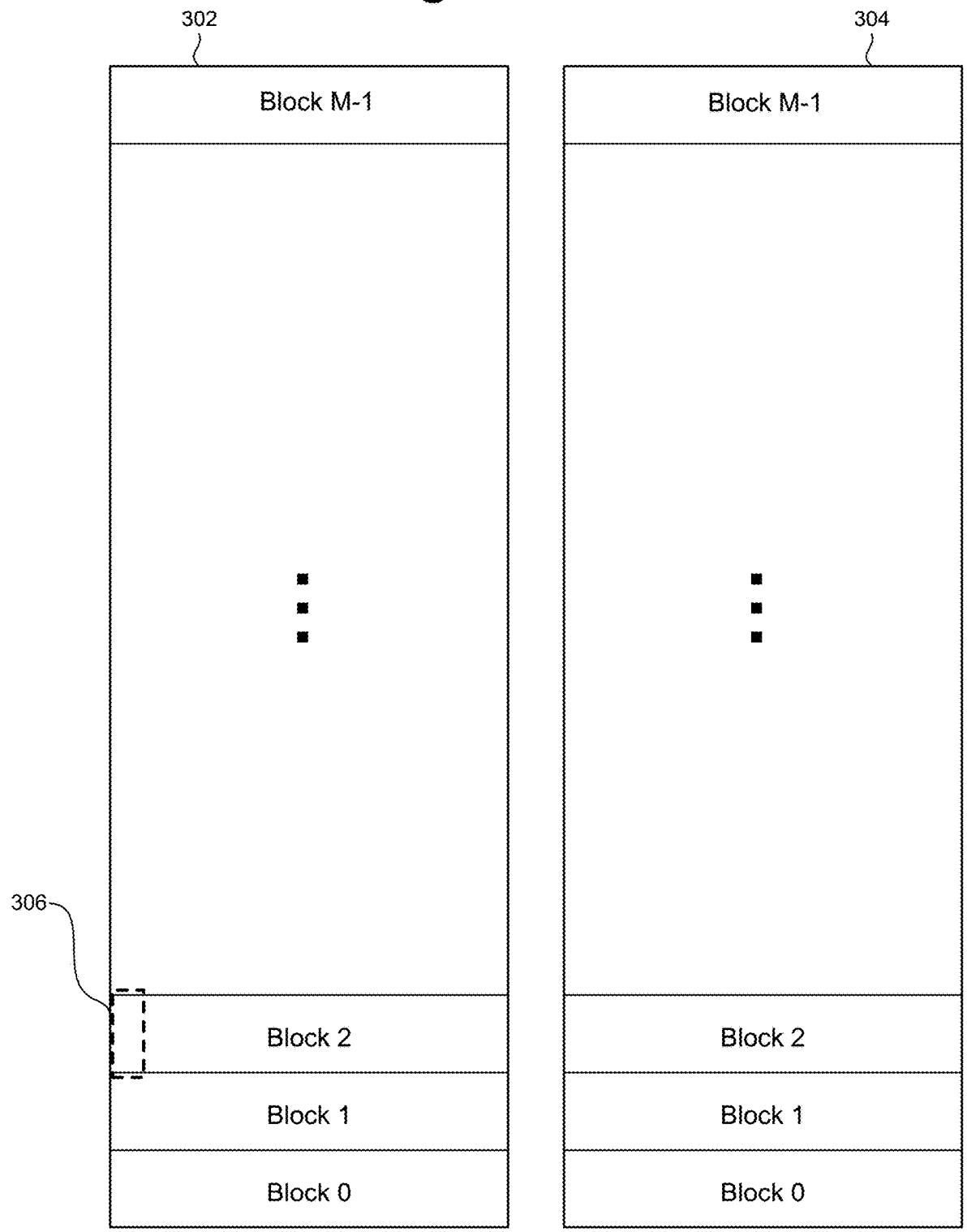
FIG. 4A is a block diagram of one embodiment of a memory structure having two planes.

FIG. 4A is a block diagram explaining one example organization of memory structure 202, which is divided into two planes 302 and 304. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 302/304, more or less than two planes can be implemented. In some embodiments, memory structure 202 includes eight planes.

Figure 4B:
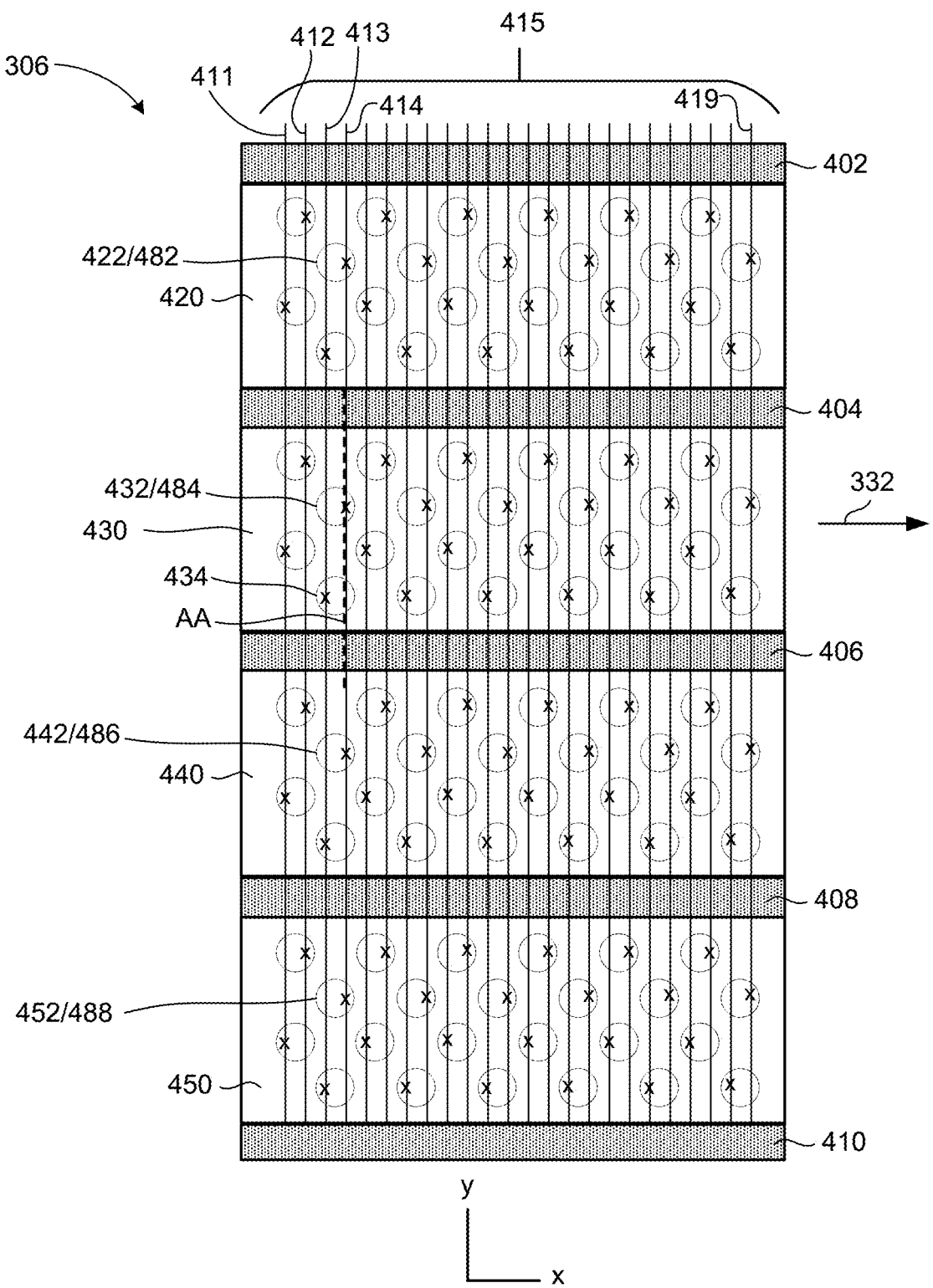
FIG. 4B depicts a top view of a portion of one embodiment of a block of memory cells.

FIGS. 4B-4E depict an example three dimensional ("3D") NAND structure that corresponds to the structure of FIG. 3 and can be used to implement memory structure 202 of FIGS. 2A and 2B. FIG. 4B is a block diagram depicting a top view of a portion of one block from memory structure 202. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 332, the block includes more vertical columns than depicted in FIG. 4B

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers or sub-blocks. In the layers of the block that implement memory cells, the four regions are referred to as word line fingers that are separated by the local interconnects. In one embodiment, the word line fingers on a common level of a block are connect together to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
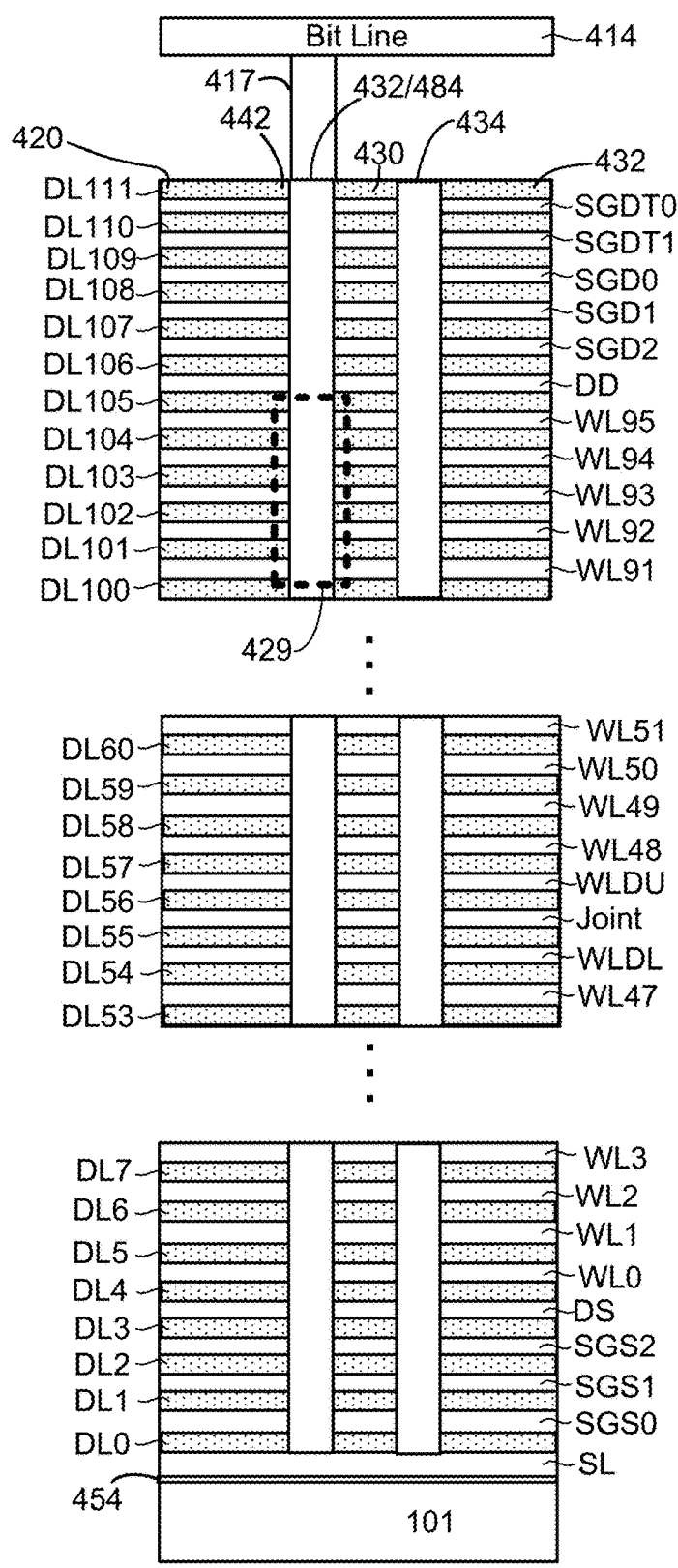
FIG. 4C depicts a cross sectional view of a portion of one embodiment of a block of memory cells.

FIG. 4C depicts a portion of one embodiment of a three dimensional memory structure 202 showing a cross-sectional view along line AA of FIG. 4B. This cross sectional view cuts through vertical columns 432 and 434 and region 430 (see FIG. 4B). The structure of FIG. 4C includes five drain side select layers SGDT0, SGDT1, SGD0, SGD1 and SGD2; three source side select layers SGS0, SGS1, and SGS2; four dummy word line layers DD, DS, WLDL and WLDU; and ninety six data word line layers WL0-WL95 for connecting to data memory cells. Other embodiments can implement more or less than five drain side select layers, more or less than three source side select layers, more or less than four dummy word line layers, and more or less than ninety six word lines. In one embodiment, SGD0, SGD1 and SGD2 are connected together; SGDT0 and SGDT1 are connected together and SGS0, SG1 and SGS2 are connected together. In one embodiment, SGD0, SGD1 and SGD2 are used to select a NAND string or a sub-block, while SGDT0 and SGDT1 are used for GIDL generation.

Vertical columns 432 and 434 are depicted protruding through the drain side select layers, source side select layers, dummy word line layers and word line layers. In one embodiment, each vertical column comprises a vertical NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 417. Local interconnects 404 and 406 are also depicted.

For ease of reference, drain side select layers; source side select layers, dummy word line layers and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL111. For example, dielectric layers DL104 is above word line layer WL94 and below word line layer WL95. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WL0-WL95 connect to memory cells (also called data memory cells). Dummy word line layers DD, DS, WLDL and WLDU connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. A dummy word line is connected to dummy memory cells. Drain side select layers SGD0, SGD1, and SGD2 are used to electrically connect and disconnect NAND strings from bit lines. Source side select layers SGS0, SGS1, and SGS2 are used to electrically connect and disconnect NAND strings from the source line SL.

FIG. 4C also shows a Joint area. In one embodiment it is expensive and/or challenging to etch ninety six word line layers intermixed with dielectric layers. To ease this burden, one embodiment includes laying down a first stack of forty eight word line layers alternating with dielectric layers, laying down the Joint area, and laying down a second stack of forty eight word line layers alternating with dielectric layers. The Joint area is positioned between the first stack and the second stack. The Joint area is used to connect to the first stack to the second stack. In one embodiment, the Joint area is made from the same materials as the word line layers. In one example set of implementations, the plurality of word lines (word lines are one example of control lines, bit lines can also be considered control lines) comprises a first stack of alternating word line layers and dielectric layers, a second stack of alternating word line layers and dielectric layers, and a joint area between the first stack and the second stack, as depicted in FIG. 4C.

Figure 4D:
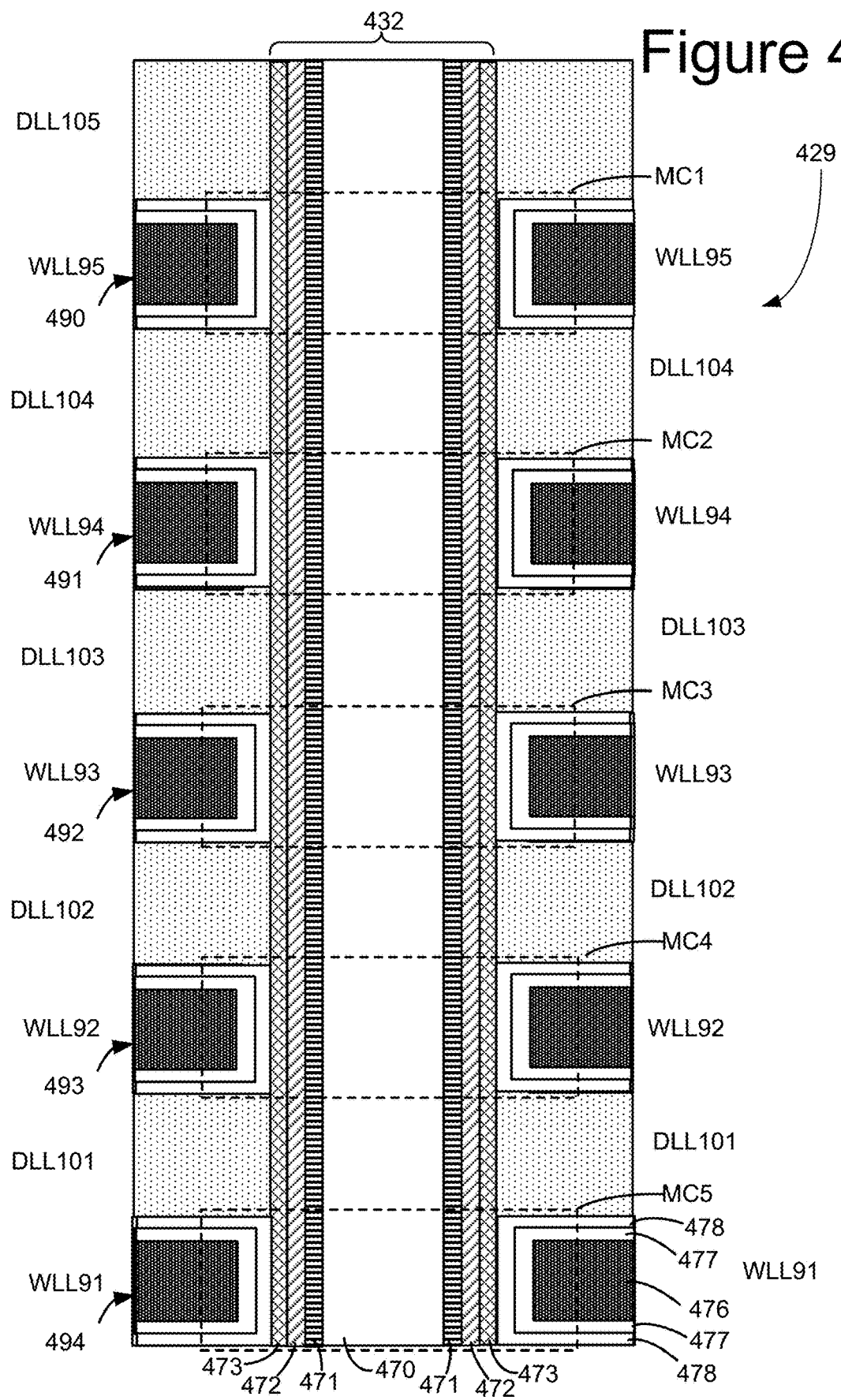
FIG. 4D is a cross sectional view of one embodiment of a vertical column of memory cells.

FIG. 4D depicts a cross sectional view of region 429 of FIG. 4C that includes a portion of vertical column 432 (a memory hole). In one embodiment, the vertical columns are round; however, in other embodiments other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line and the source line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4D depicts dielectric layers DLL105, DLL104, DLL103, DLL102 and DLL101, as well as word line layers WLL95, WLL94, WLL93, WLL92, and WLL91. Each of the word line layers includes a word line region 476 surrounded by an aluminum oxide layer 477, which is surrounded by a blocking oxide layer 478. In other embodiments, the blocking oxide layer can be a vertical layer parallel and adjacent to charge trapping layer 473. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL95 and a portion of vertical column 432 comprise a memory cell MC1. Word line layer WLL94 and a portion of vertical column 432 comprise a memory cell MC2. Word line layer WLL93 and a portion of vertical column 432 comprise a memory cell MC3. Word line layer WLL92 and a portion of vertical column 432 comprise a memory cell MC4. Word line layer WLL91 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as GIDL.

Figure 4E:
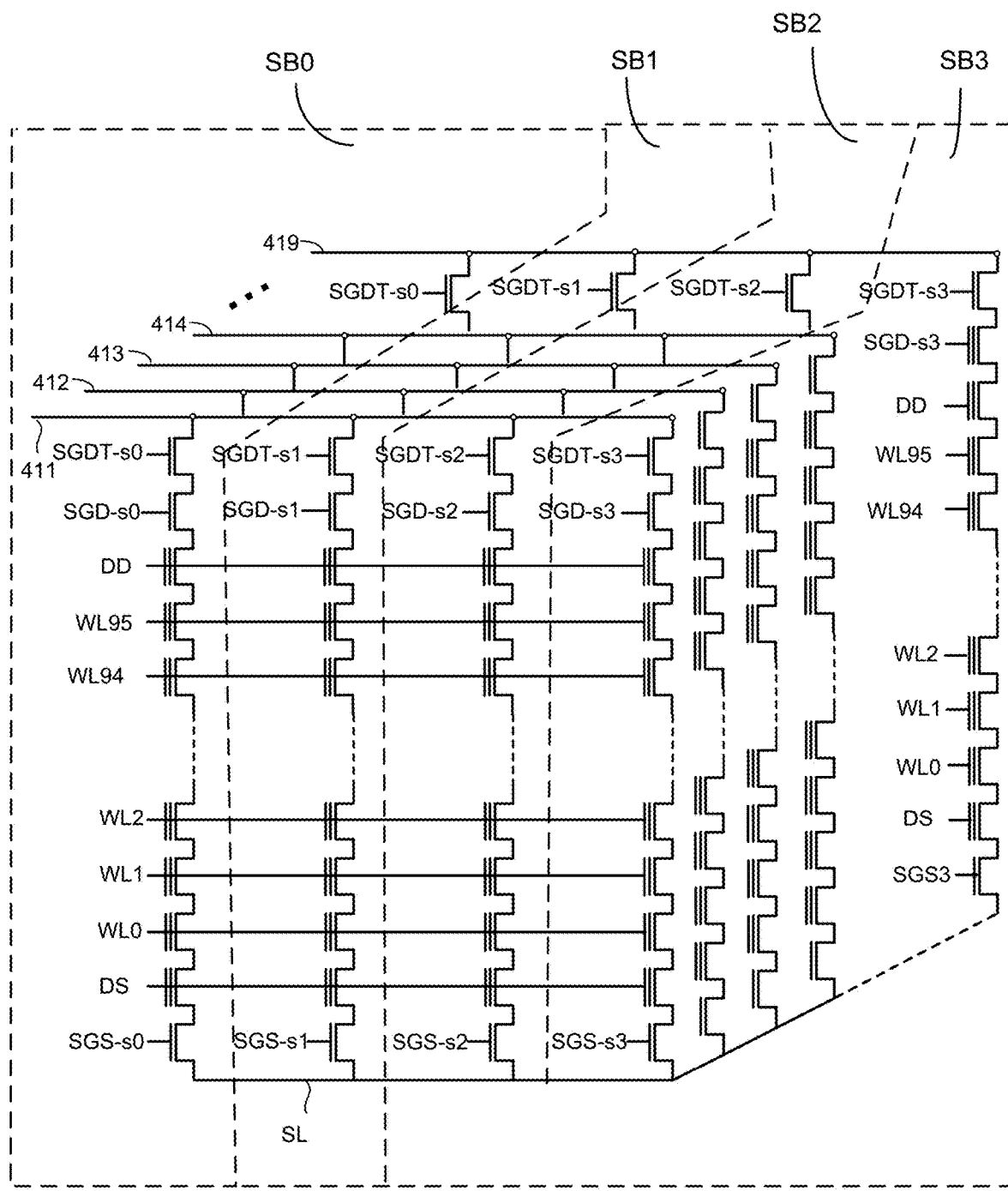
FIG. 4E is a schematic of a plurality of NAND strings showing multiple sub-blocks.

FIG. 4E is a schematic diagram of a portion of the memory depicted in in FIGS. 3-4D. FIG. 4E shows physical data word lines WL0-WL95 running across the entire block. The structure of FIG. 4E corresponds to portion 306 in Block 2 of FIGS. 4A-D, including bit lines 411, 412, 413, 414, . . . 419. Within the block, in one embodiment, each bit line is connected to four NAND strings. As mentioned above with respect to FIG. 4C, in one embodiment, SGD0, SGD1 and SGD2 are connected together to operate as a single logical select gate that is represented in FIG. 4E as SGD (SGD-s0, SGD-s1, SGD-s2, SGD-s3); SGDT0 and SGDT1 are connected together to operate as a single logical gate that is represented in FIG. 4E as SGT(SGDT-s0, SGDT-s1, SGDT-s2, SGDT-s3); and SGS0, SG1 and SGS2 are connected together to operate as a single logical select gate that is represented in FIG. 4E as SGS (SGS-s0, SGS-s1, SGS-s2, SGS-s3).

The block can also be thought of as divided into four sub-blocks SB0, SB1, SB2 and SB3. In one embodiment. the data word line layers of each sub-block are connected together. In one embodiment, the drain side select layers (SGD0, SGD1 and SGD2) are electrically divided by local interconnects LI (see above) into four separate drain side select lines and gates (transistors) SGD-s0, SGD-s1, SGD-s2, SGD-s3 such that there is one per sub-block so that each sub-block can be independently selected. Similarly, the SGT layers are divided by local interconnects L1 (see above) into four separate lines and gates (transistors) SGDT-s0, SGDT-s1, SGDT-s2, SGDT-s3 such that there is one per sub-block so that GIDL can be generated separately and independently for each sub-block. The source side select layers (SGS0, SGS1 and SGS2) are electrically divided by local interconnects LI (see above) into four separate source side select lines and gates (transistors) SGS-s0, SGS-s1, SGS-s2, SGS-s3 such that there is one per sub-block so that each sub-block can be independently selected.

Sub-block SB0 corresponds to those vertical NAND strings controlled by SGD-s0 and SGS-s0, sub-block SB1 corresponds to those vertical NAND strings controlled by SGD-s1 and SGS-s1, sub-block SB2 corresponds to those vertical NAND strings controlled by SGD-s2 and SGS-s2, and sub-block SB3 corresponds to those vertical NAND strings controlled by SGD-s3 and SGS-s3.

Figure 4F:
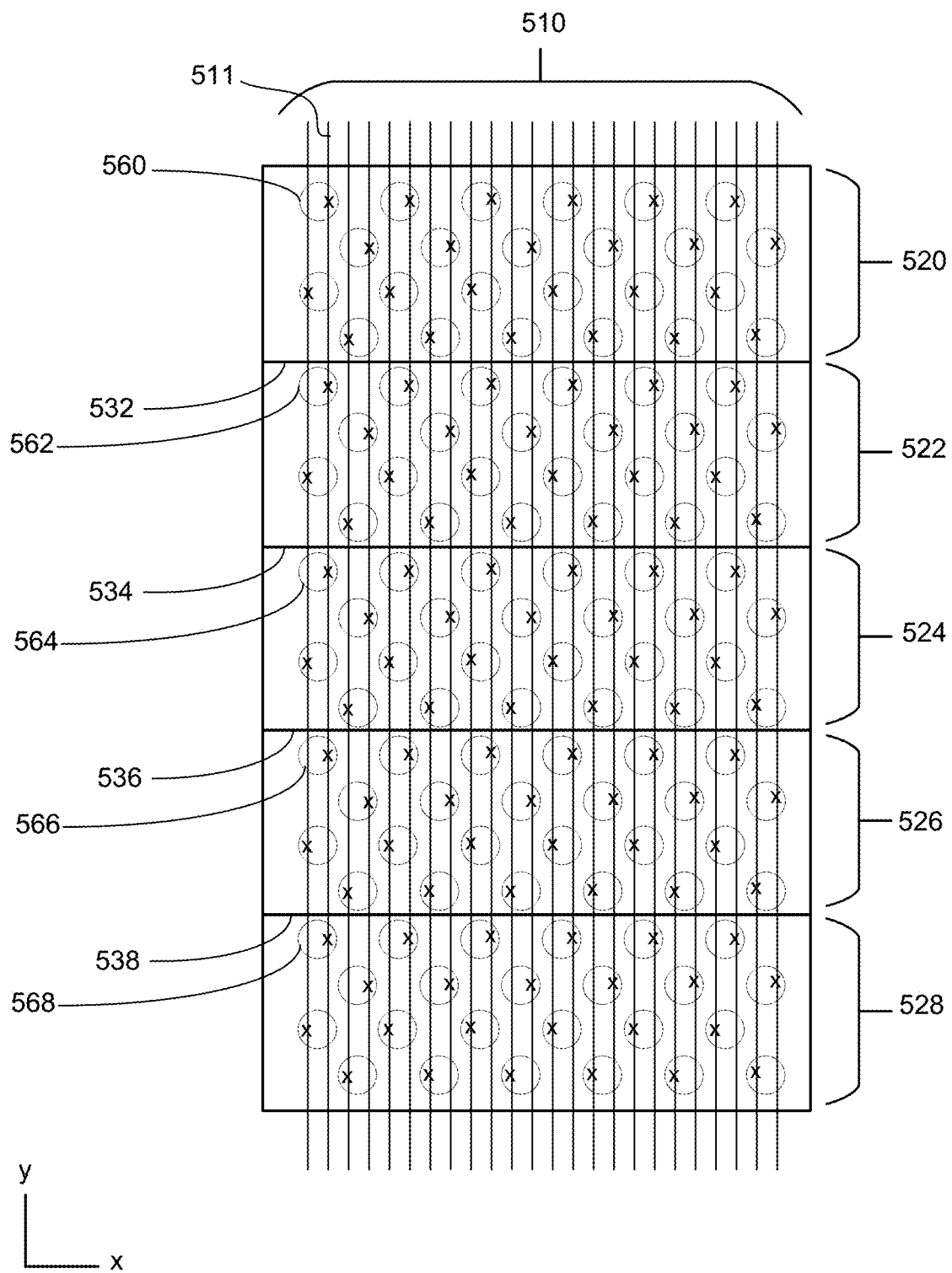
FIG. 4F depicts a top view of a portion of one embodiment of a block of memory cells.

FIG. 4F is a block diagram depicting a top view of a portion of one block from another embodiment of memory structure 202. In one embodiment, the memory structure has many layers; however, FIG. 4F only shows the top layer. The block of FIG. 4F is divided into six sub-blocks 520, 522, 524, 526, and 528. The block depicted in FIG. 4F includes a set of dividers 532, 534, 536 and 538 that separate and electrically isolate the SDT, SGD and SGS layers, but not the data word line layers. That is, in one embodiment, the data word lines (WL0, WL1, WL95) are continuous and connected to all vertical columns (NAND strings) of the block.

FIG. 4F depicts a plurality of circles that represent the vertical columns. Each of the vertical columns include multiple select transistors and multiple memory cells. In one embodiment, each vertical column implements a NAND string. For example, FIG. 4F depicts vertical columns 560, 562, 564, 566 and 568. FIG. 4F also depicts a set of bit lines 510 (including bit line 511). Each of the circles representing vertical columns has an "x" to indicate its connection to one bit line. For example, bit line 511 is connected to vertical columns vertical columns 560, 562, 564, 566 and 568.

Figure 4G:
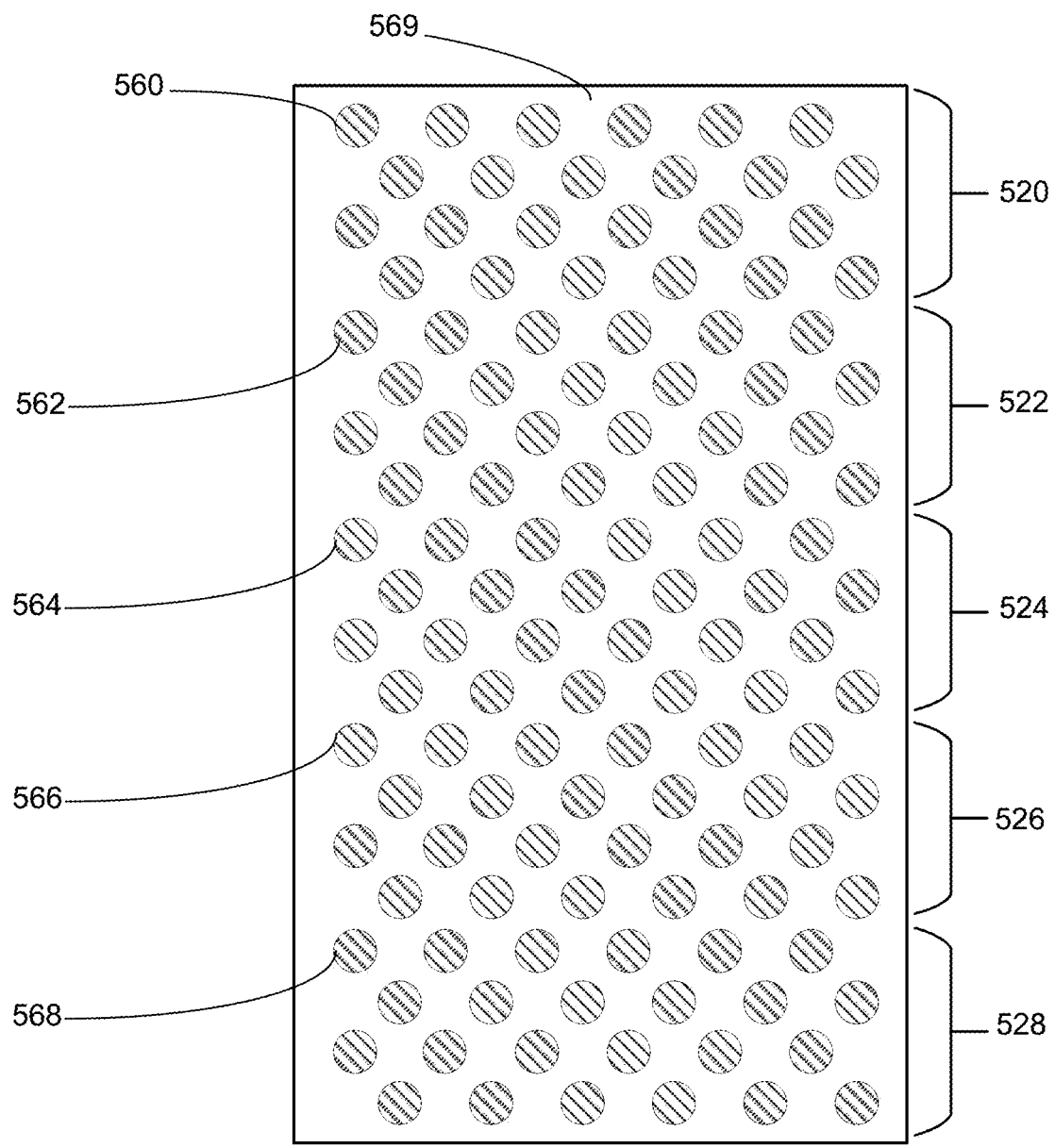
FIG. 4G depicts a top view of a portion of one embodiment of a block of memory cells.

As mention above, dividers 532, 534, 536 and 538 separate and electrically isolate the SDT, SGD and SGS layers, but not the data word line layers. FIG. 4G is a top view of a data word line 569 layer showing a cutaway view of the vertical columns (e.g., NAND strings) 560, 562, 564, 566 and 568. The vertical columns are depicted as shaded circle. FIG. 4G shows that although the vertical columns (e.g., NAND strings) 560, 562, 564, 566 and 568 are divided into sub-blocks 520, 522, 524, 526, and 528, the word line layer 569 (which can be any of WL0-WL95) is continuous and connected to all vertical columns (NAND strings) of the block.

Figure 4H:
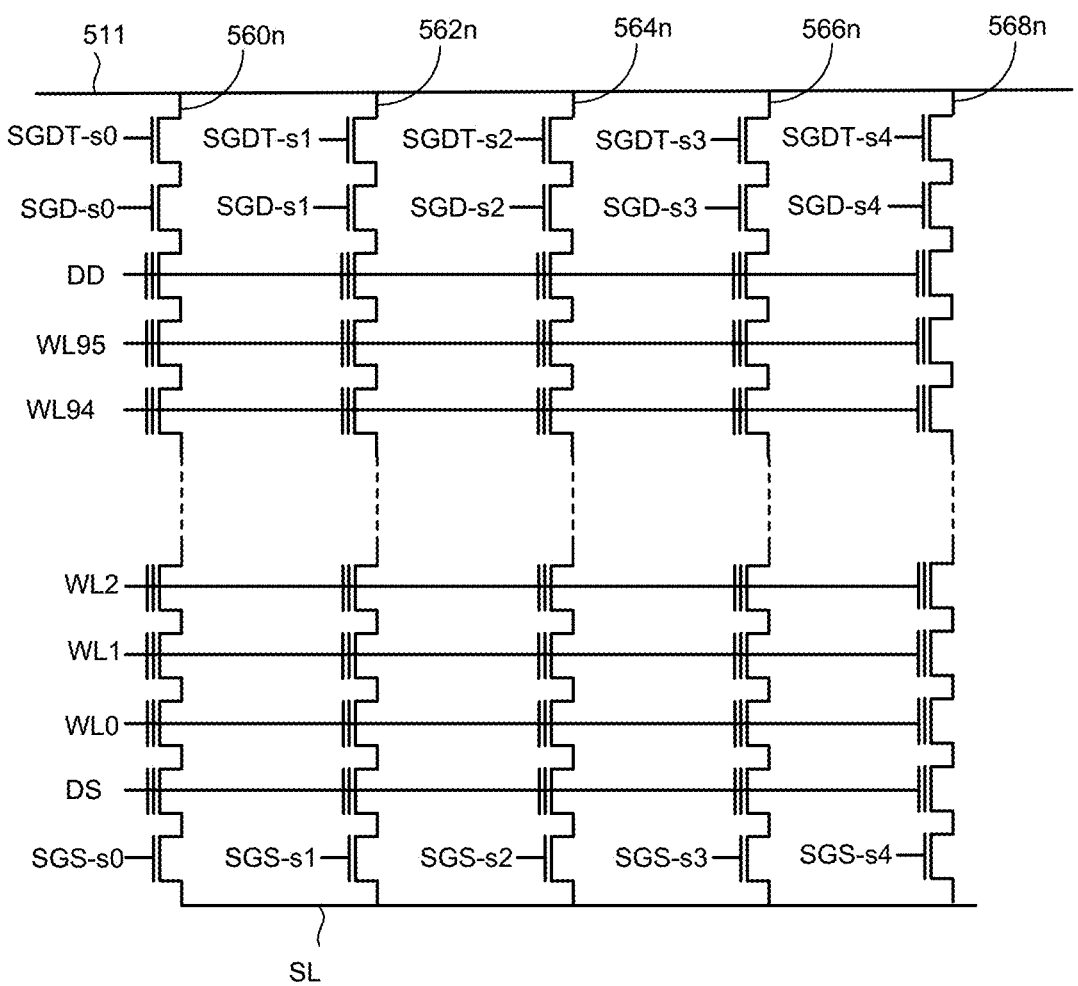
FIG. 4H is a schematic of one embodiment of a plurality of NAND strings showing multiple sub-blocks.

FIG. 4H is a schematic diagram of a portion of the memory depicted in in FIGS. 4F and 4G. FIG. 4E shows physical data word lines WL0-WL95 running across the entire block. Within the block, in one embodiment, each bit line is connected to five NAND strings. The block is divided into five sub-blocks 520, 522, 524, 526 and 528. In one embodiment. the data word line layers of each sub-block are connected together. In one embodiment, the drain side select layers (SGD0, SGD1 and SGD2) are electrically divided into five separate drain side select lines and gates (transistors) SGD-s0, SGD-s1, SGD-s2, SGD-s3 and SGD-s4 such that there is one per sub-block so that each sub-block can be independently selected. Similarly, the SGT layers are divided into four separate lines and gates (transistors) SGDT-s0, SGDT-s1, SGDT-s2, SGDT-s3 and SDT-s4 such that there is one per sub-block so that GIDL can be generated separately and independently for each sub-block. The source side select layers (SGS0, SGS1 and SGS2) are electrically divided into four separate source side select lines and gates (transistors) SGS-s0, SGS-s1, SGS-s2, SGS-s3 and SGS-s3 such that there is one per sub-block so that each sub-block can be independently selected.

Sub-block 520 includes those vertical NAND strings controlled by SGD-s0 and SGS-s0. For example, sub-block 520 includes NAND string 560$n$ which corresponds to vertical column 560. Sub-block 522 includes those vertical NAND strings controlled by SGD-s1 and SGS-s1. For example, sub-block 522 includes NAND string 562$n$ which corresponds to vertical column 562. Sub-block 524 includes those vertical NAND strings controlled by SGD-s2 and SGS-s2. For example, sub-block 524 includes NAND string 564$n$ which corresponds to vertical column 564. Sub-block 526 includes those vertical NAND strings controlled by SGD-s3 and SGS-s3. For example, sub-block 526 includes NAND string 566$n$ which corresponds to vertical column 566. Sub-block 528 includes those vertical NAND strings controlled by SGD-s4 and SGS-s4. For example, sub-block 528 includes NAND string 568$n$ which corresponds to vertical column 568.

Although the example memories of FIGS. 3-4H are three dimensional memory structure that includes vertical NAND strings with charge-trapping material, other (2D and 3D) memory structures can also be used with the technology described herein.

Figures 5, 5A:
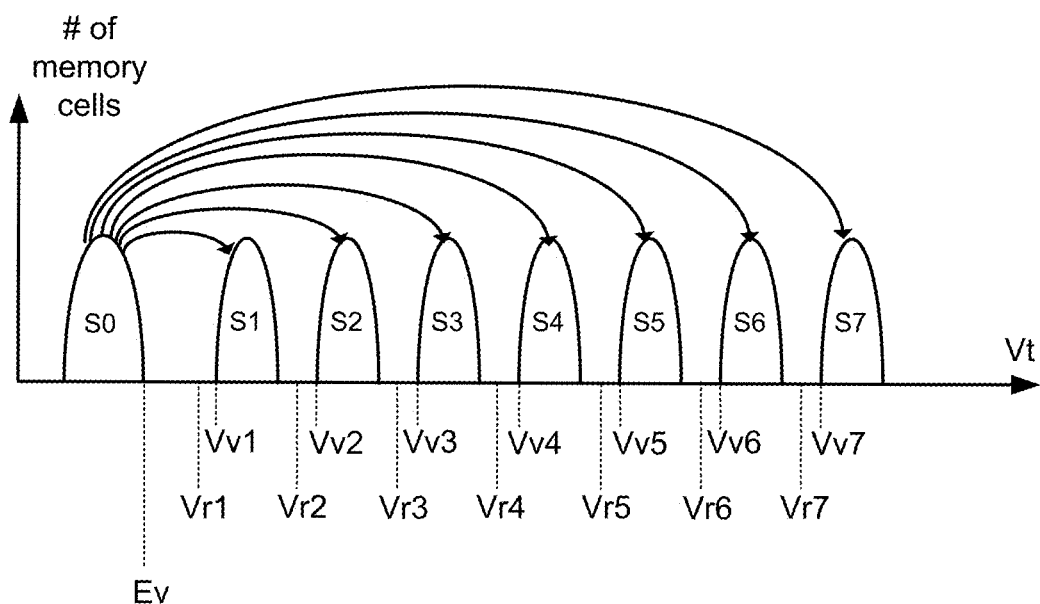
FIG. 5 depicts threshold voltage distributions.
FIG. 5A is a table describing one example of an assignment of data values to data states.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 is a graph of threshold voltage versus number of memory cells, and illustrates example threshold voltage distributions for the memory array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. For a data state N, that data state N has higher threshold voltages than data state N−1 and lower threshold voltages than data state N+1. The first threshold voltage distribution (data state) S0 represents memory cells that are erased. The other seven threshold voltage distributions (data states) S1-S7 represent memory cells that are programmed and, therefore, are also called programmed states or programmed data states. In some embodiments, data states S1-S7 can overlap, with controller 122 relying on error correction to identify the correct data being stored.

FIG. 5 shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 5 also shows seven verify reference voltages, Vv1, Vv2, Vv3, Vv4, Vv5, Vv6, and Vv7 (also referred to as verify target voltages). When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming including (but not limited to) multiple stage/phase programming.

Each threshold voltage distribution (data state) of FIG. 5 corresponds to predetermined values for the set of data bits stored in the memory cells. The specific relationship between the data programmed into the memory cell and the threshold voltage levels of the memory cell depends upon the data encoding scheme adopted for the memory cells. In one embodiment, data values are assigned to the threshold voltage ranges using a Gray code assignment so that if the threshold voltage of a memory erroneously shifts to its neighboring physical state, only one bit will be affected.

Figure 6:
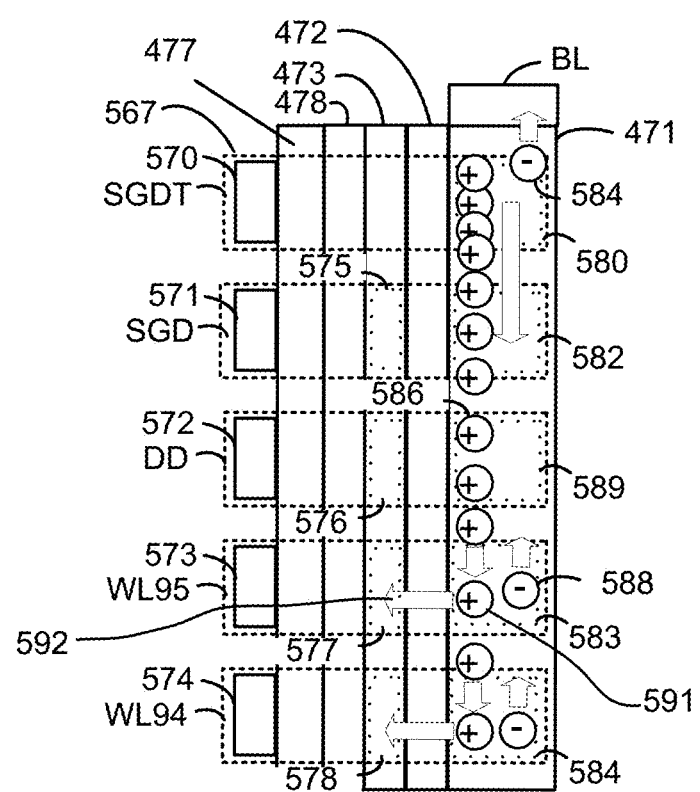
FIG. 6 depicts a portion of a NAND string, showing an example of GIDL generation.

FIG. 5A is a table describing one example of an assignment of data values to data states. In the table of FIG. 6, S0=111 (erased state), S1=110, S2=100, S3=000, S4=010, S5=011, S6=001 and S7=101. Other encodings of data can also be used. No particular data encoding is required by the technology disclosed herein. In one embodiment, when a block is subjected to an erase operation, all memory cells are moved to data state S0, the erased state.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 5) or verify operation (e.g. see verify reference voltages Ev, Vv1, Vv2, Vv3, Vv4, Vv5, Vv6, and Vv7 of FIG. 5) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the non-volatile storage elements (memory cells). Herein, this is referred to as p-well erase.

Another approach to erasing memory cells is to generate gate induced drain leakage (GIDL) current to charge up the NAND string channel. An erase enable voltage is applied to control gates of the memory cells, while maintaining the NAND string channel potential to erase the memory cells. Herein, this is referred to as GIDL erase. Both p-well erase and GIDL erase may be used to lower the threshold voltage (Vt) of memory cells.

In one embodiment, the GIDL current is generated by causing a drain-to-gate voltage at a select transistor (e.g., SGD and/or SGS). A transistor drain-to-gate voltage that generates a GIDL current is referred to herein as a GIDL voltage. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel, thereby raising potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the threshold voltage of the memory cells.

The GIDL current may be generated at either end of the NAND string. A first GIDL voltage may be created between two terminals of a select transistor (e.g., drain side select transistor) that is connected to or near a bit line to generate a first GIDL current. A second GIDL voltage may be created between two terminals of a select transistor (e.g., source side select transistor) that is connected to or near a source line to generate a second GIDL current. Erasing based on GIDL current at only one end of the NAND string is referred to as a one-sided GIDL erase. Erasing based on GIDL current at both ends of the NAND string is referred to as a two-sided GIDL erase.

FIG. 6 depicts one example of the movement of holes and electrons at the drain side of a NAND string during a GIDL based erase operation. An example NAND string includes a channel 471 connected to a bit line (BL). A tunneling dielectric 472, charge trapping layer 473, blocking oxide layer 478 and aluminum oxide layer 477 are layers which extend around the memory hole. Different regions of the channel layers represent channel regions which are associated with respective memory cells or select gate transistors. These channel regions are at a same height and stack level in the stacked memory device as the control gates of the storage elements or select gate transistors. The NAND string includes a SGDT transistor 567 (which comprises a SGDT0 and SGDT1 transistor combined, as discussed above) with a control gate 570 and a channel region 580. The NAND string also includes a SGD transistor 575 with a control gate 571 and a channel region 582. A dummy memory cell DSD 576 includes a control gate 572 and channel region 589. The NAND string also includes data memory cells 577 and 578 with control gates 573 and 574, and channel regions 583 and 584. Representative holes are depicted in the channel layers as circles with a "+" sign and representative electrons are depicted in the channel layers as circles with a "−" sign. Electron-hole pairs are generated by a GIDL process.

Initially, during an erase operation, the electron-hole pairs are generated at the SGDT transistor 567. The holes move into the channel, thereby charging the channel to a positive potential. As GIDL is generated, the holes move away from the SGDT transistor 567 in the channel in the direction toward the source side of the NAND string. The electrons generated at the SGDT transistor 567 move toward the bit line (BL) due to the positive potential there. Subsequently, during the erase period of each memory cell, additional holes are generated by GIDL at virtual junctions which are formed in the channel at the edges of the control gate of the storage element. However, some holes are also removed from the channel as they tunnel to the charge trapping layer 473.

FIG. 6 depicts that at one end (e.g., drain side) of the NAND string, example electrons 584 and 585 move toward the bit line. Electron 584 is generated at the SGDT transistor and electron 588 is generated at a junction of the memory cell 577 in the channel region 583. Also, at the drain side of the NAND string, example holes including a hole 591 moving away from the bit line as indicated by the arrows. The hole 591 is generated at a junction of the memory cell 577 in the channel region 583 and can tunnel into the charge trapping layer 473 as indicated by arrow 592.

Figure 7:
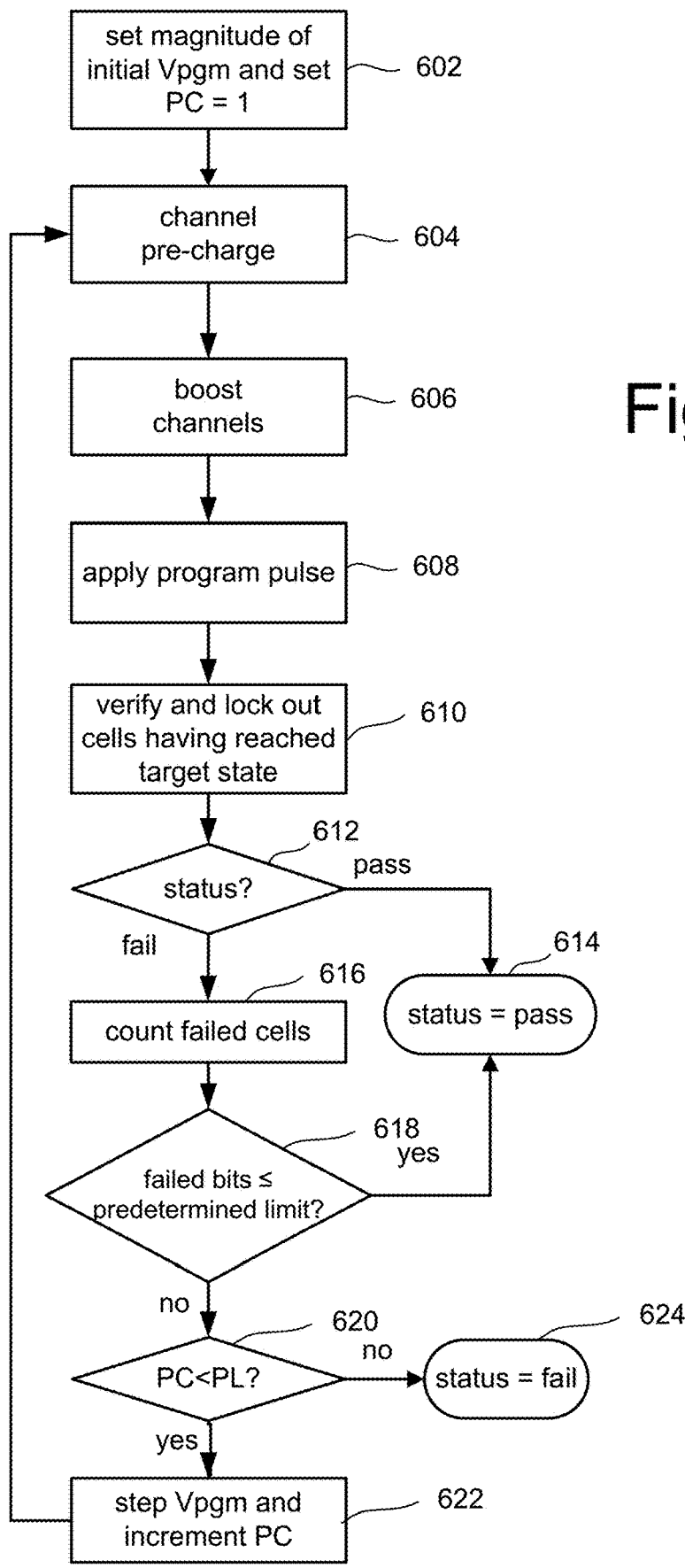
FIG. 7 is a flow chart describing one embodiment of a process for programming non-volatile memory.

FIG. 7 is a flowchart describing one embodiment of a process for programming that is performed by memory die 200 and/or integrated assembly 207. In one example embodiment, the process of FIG. 7 is performed on memory die 200 using the one or more control circuits (e.g., system control logic 260, column control circuitry 210, row control circuitry 220) discussed above. In one example embodiment, the process of FIG. 7 is performed by integrated memory assembly 207 using the one or more control circuits (e.g., system control logic 260, column control circuitry 210, row control circuitry 220) of control die 211 to program memory cells on memory die 201. The process includes multiple loops, each of which includes a program phase and a verify phase. The process of FIG. 7 is performed to implement the full sequence programming, as well as other programming schemes including multi-stage programming. When implementing multi-stage programming, the process of FIG. 7 is used to implement any/each stage of the multi-stage programming process.

Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 602 of FIG. 7, the program voltage (Vpgm) is initialized to the starting magnitude (e.g., —12-20V or another suitable level) and a program counter PC maintained by state machine 262 is initialized at 1.

In one embodiment, the set of memory cells selected to be programmed (referred to herein as the selected memory cells) are programmed concurrently and are all connected to the same data word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the storage system will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected data word lines receive one or more boosting voltages (e.g., —7-11 volts) to perform boosting schemes. A program inhibit voltage is applied to the bit lines coupled the unselected NAND string.

In step 608, a program pulse (e.g., voltage pulse) of the program signal Vpgm is applied to the selected word line (the data word line selected for programming). If a memory cell on a NAND string should be programmed, then the corresponding bit line is biased at a program enable voltage, in one embodiment. Herein, such a NAND string is referred to as a "selected NAND string." In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all the memory cells connected to the selected word line will concurrently have their Vt change, unless they are inhibited from programming.

In step 610, memory cells that have reached their target states are locked out from further programming. Step 610 may include performing verifying at one or more verify reference levels. In one embodiment, the verification process is performed by testing whether the threshold voltages of the memory cells selected for programming have reached the appropriate verify reference voltage.

In step 610, a memory cell may be locked out after the memory cell has been verified (by a test of the Vt) that the memory cell has reached its target state. If, in step 612, it is determined that all of the memory cells have reached their target threshold voltages (pass), the programming process is complete and successful because all selected memory cells were programmed and verified to their target states. A status of "PASS" is reported in step 614. Otherwise if, in step 612, it is determined that not all the memory cells have reached their target threshold voltages (fail), then the programming process continues to step 616.

In step 616, the system counts the number of memory cells that have not yet reached their respective target Vt distribution. That is, the system counts the number of memory cells that have, so far, failed to reach their target state. This counting can be done by the state machine 262, the memory controller 120, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for a page (e.g., the unit of programming and the unit of reading) of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming less than all of the memory cells for a page, or comparing a count for only one data state (or less than all states), than the predetermined limit can be a pro-rata (or other) portion of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 620 and the program counter PC is checked against the program limit value (PL). Examples of program limit values include 1, 12, 16, 20 and 30; however, other values can be used. If the program counter PC is not less than the program limit value PL, then the program process is considered to have failed and a status of FAIL is reported in step 624. If the program counter PC is less than the program limit value PL, then the process continues at step 622 during which time the Program Counter PC is incremented by 1 and the program voltage Vpgm is stepped up to the next magnitude. For example, the next pulse will have a magnitude greater than the previous pulse by a step size (e.g., a step size of 0.1-1.0 volts). After step 622, the process loops back to step 604 and another program pulse is applied to the selected word line so that another iteration (steps 604-622) of the programming process of FIG. 7 is performed.

Because it is possible that errors can occur when programming or reading, and errors can occur while storing data (e.g., due to electrons drifting, data retention issues or other phenomenon), error correction is used with the programming of data. Memory systems often use Error Correction Codes (ECC) to protect data from corruption. Many ECC coding schemes are well known in the art. These conventional error correction codes are especially useful in large scale memories, including flash (and other non-volatile) memories, because of the substantial impact on manufacturing yield and device reliability that such coding schemes can provide, rendering devices that have a few non-programmable or defective cells as useable. Of course, a tradeoff exists between the yield savings and the cost of providing additional memory cells to store the code bits (i.e., the code "rate"). As such, some ECC codes are better suited for flash memory devices than others. Generally, ECC codes for flash memory devices tend to have higher code rates (i.e., a lower ratio of code bits to data bits) than the codes used in data communications applications (which may have code rates as low as 1/2). Examples of well-known ECC codes commonly used in connection with flash memory storage include Reed-Solomon codes, other BCH codes, Hamming codes, and the like. Sometimes, the error correction codes used in connection with flash memory storage are "systematic," in that the data portion of the eventual code word is unchanged from the actual data being encoded, with the code or parity bits appended to the data bits to form the complete code word.

The particular parameters for a given error correction code include the type of code, the size of the block of actual data from which the code word is derived, and the overall length of the code word after encoding. For example, a typical BCH code applied to a sector of 512 bytes (4096 bits) of data can correct up to four error bits, if at least 60 ECC or parity bits are used. Reed-Solomon codes are a subset of BCH codes, and are also commonly used for error correction. For example, a typical Reed-Solomon code can correct up to four errors in a 512 byte sector of data, using about 72 ECC bits. In the flash memory context, error correction coding provides substantial improvement in manufacturing yield, as well as in the reliability of the flash memory over time.

In some embodiments, memory controller 120 receives host data (also referred to as user data or data from an entity external to the memory system), also referred to as information bits, that is to be stored non-volatile memory structure 202. The informational bits are represented by the matrix i=[1 0] (note that two bits are used for example purposes only, and many embodiments have code words longer than two bits). An error correction coding process (such as any of the processes mentioned above or below) is implemented by ECC engine 158 of memory controller 120 in which parity bits are added to the informational bits to provide data represented by the matrix or code word v=[1 0 1 0], indicating that two parity bits have been appended to the data bits. Other techniques can be used that map input data to output data in more complex manners. For example, low density parity check (LDPC) codes, also referred to as Gallager codes, can be used. More details about LDPC codes can be found in R. G. Gallager, "Low-density parity-check codes," IRE Trans. Inform. Theory, vol. IT-8, pp. 21 28, Jan. 1962; and D. MacKay, Information Theory, Inference and Learning Algorithms, Cambridge University Press 2003, chapter 47. In practice, such LDPC codes are typically applied (e.g., by ECC engine 158) to multiple pages encoded across a number of memory cells, but they do not need to be applied across multiple pages. The data bits can be mapped to a logical page and stored in memory structure 202 by programming one or more memory cells to one or more programming states, which corresponds to v.

In one embodiment, programming serves to raise the threshold voltage of the memory cells to one of the programmed data states S1-S7, and erasing serves to lower the threshold voltage of the memory cells to the Erase data state S0.

Figure 8:
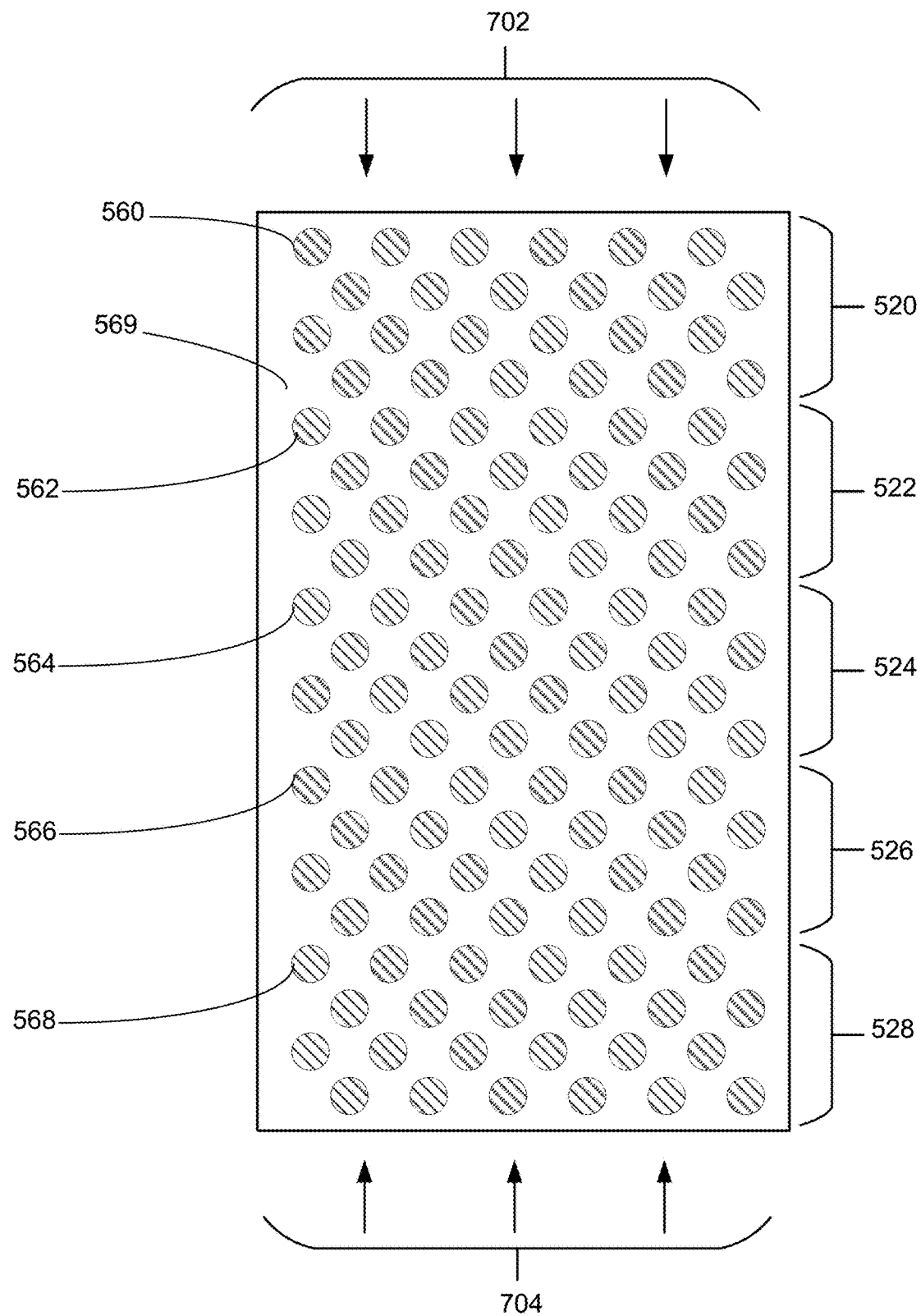
FIG. 8 depicts a top view of a portion of one embodiment of a block of memory cells.

As depicted in FIG. 4D, each of the word line layers includes a word line layer 476 surrounded by an aluminum oxide layer 477, which is surrounded by blocking oxide layer 478. When manufacturing the memory structure 202, the word line layers are pre-filled by SiN. Subsequently, the SiN is removed to reveal a cavity and the cavity is filled with word line layer 476, aluminum oxide layer 477 and blocking oxide layer 478. The aluminum oxide layer 477 is added as part of a deposition process in which the aluminum oxide chemicals are inserted into the cavity from the edges of the block. FIG. 8 shows the same top view of data word line 569 layer as FIG. 4G, with arrows 702 and 704 depicting where the aluminum oxide chemicals are inserted into the cavity from the edges of the block. The aluminum oxide chemicals need to travel from the edge of the word line layer to the middle of the block (e.g., corresponding to sub-block 524). Since the outer sub-blocks (e.g., sub-bocks 520 and 528) see the aluminum oxide chemicals first, the aluminum oxide layer 477 for vertical columns (NAND strings) in outer sub-blocks (e.g., sub-bocks 520 and 528) is thicker than aluminum oxide layer 477 for vertical columns (NAND strings) in inner sub-blocks (e.g., sub-bocks 522, 524 and 526). Vertical columns (NAND strings) with a thicker aluminum oxide layer 477 erase slower than vertical columns (NAND strings) with a thinner aluminum oxide layer 477. Vertical columns (NAND strings) with a thinner aluminum oxide layer 477 erase faster than vertical columns (NAND strings) with a thicker aluminum oxide layer 477. In the embodiment of FIG. 8, NAND strings in inner sub-blocks (e.g., sub-bocks 522, 524 and 526) will erase faster than NAND strings in outer sub-blocks (e.g., sub-bocks 520 and 528). The vertical columns (NAND strings) that erase faster may be more likely to over-erase. An example of over-erasing is when the threshold voltage of a memory cell being erased becomes lower than the threshold voltages of the erased threshold voltage distribution (see S0 of FIG. 5). Over-erasing can cause a reduction in endurance, a decline in data retention, and an increase in potential for defects to manifest.

Figure 9:
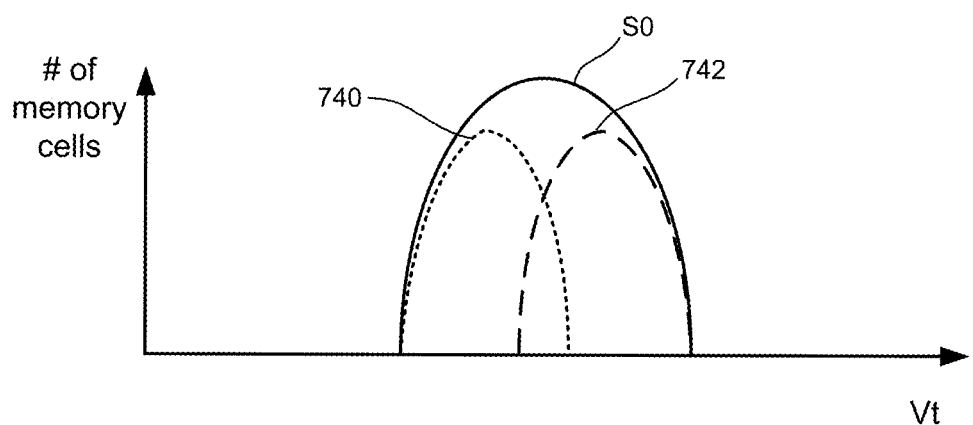
FIG. 9 depicts an example of a threshold voltage distribution for memory cells that have been erased.

The difference in erase speed between NAND strings in inner sub-blocks (e.g., sub-bocks 522, 524 and 526) and NAND strings in outer sub-blocks (e.g., sub-bocks 520 and 528) is depicted in FIG. 9, which shows threshold voltage distribution S0 (see also FIG. 5) for the entire population of memory cells being erased. FIG. 9 also depicts threshold voltage distribution 740 for NAND strings in inner sub-blocks (e.g., sub-bocks 522, 524 and 526) being erased and threshold voltage distribution 742 for NAND strings in outer sub-blocks (e.g., sub-bocks 520 and 528) being erased. As depicted, threshold voltage distribution 740 is lower than threshold voltage distribution 742 as NAND strings in inner sub-blocks (e.g., sub-bocks 522, 524 and 526) will erase faster than NAND strings in outer sub-blocks (e.g., sub-bocks 520 and 528).

Figure 10:
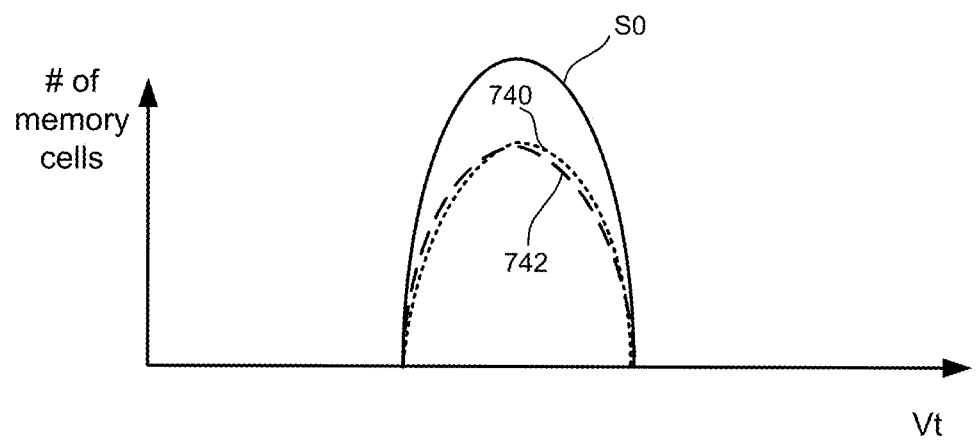
FIG. 10 depicts an example of a threshold voltage distribution for memory cells that have been erased.

To avoid the problems of over-erasing discussed above, it is desired that the NAND strings (or other groups of memory cells) of the different sub-blocks erase at similar speeds, such as depicted in FIG. 10 where threshold voltage distribution 740 is the same or almost the same as threshold voltage distribution 742. To achieve this result depicted in FIG. 10, it is proposed to adjust the speed of the erase process (or other memory operation) for either NAND strings in inner sub-blocks (e.g., sub-bocks 522, 524 and 526) or NAND strings in outer sub-blocks (e.g., sub-bocks 520 and 528) so that all NAND strings erase at a similar speed. For example, the GIDL generation can be dampened for NAND strings in inner sub-blocks (e.g., sub-bocks 522, 524 and 526) in order to slow down the erasing of NAND strings in inner sub-blocks (e.g., sub-bocks 522, 524 and 526) so that NAND strings in inner sub-blocks (e.g., sub-bocks 522, 524 and 526) erase at a similar speed as NAND strings in outer sub-blocks (e.g., sub-bocks 520 and 528). Such a technique will result in an erase process that has threshold voltage distributions more like FIG. 10 then like FIG. 9. Alternatively, the GIDL generation can be increased for NAND strings in outer sub-blocks (e.g., sub-bocks 520 and 528).

The technology described herein is not limited to erase operations. Rather, the technology can be applied to other memory operations in order to adjust the speed of the memory operation for a subset of memory cells by adjusting GIDL during the memory operation.

Figure 11:
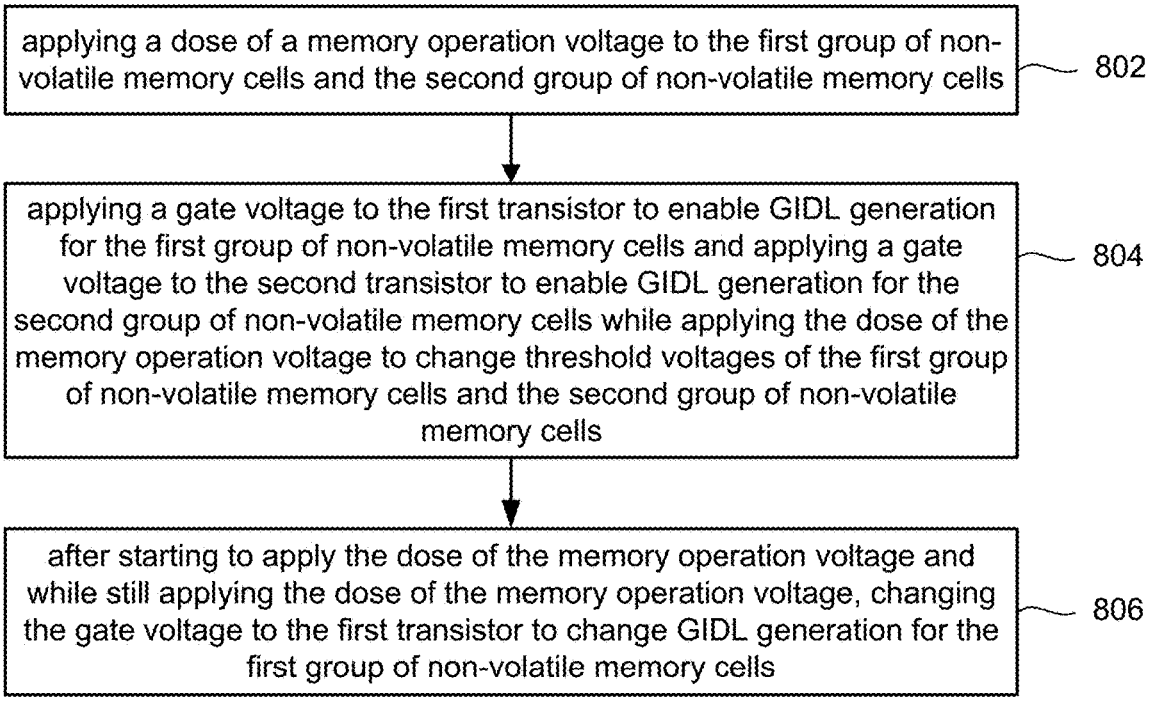
FIG. 11 is a flow chart describing one embodiment of a process for performing a memory operation that includes adjusting the speed of the memory operation for a subset of memory cells by adjusting GIDL during the memory operation.

FIG. 11 is a flow chart describing one embodiment of a process for performing a memory operation that includes adjusting the speed of the memory operation for a subset of memory cells by adjusting GIDL during the memory operation. The process of FIG. 11 can be performed by any of the one or more control circuits discussed above. For example, the process of FIG. 11 can be performed by or at the direction of memory controller 120 and/or state machine 262 (and/or another processor). Step 802 of FIG. 11 includes applying a dose of a memory operation voltage to the first group of non-volatile memory cells and the second group of non-volatile memory cells. For example, an erase voltage pulse can be applied to a NAND string in an inner sub-block and a NAND string in an outer sub-block. In one embodiment, the memory operation is an erase operation and the memory operation voltage is a voltage signal that comprises a plurality of erase voltage pulses that are applied to the bit line and the source line such that the magnitude of the pulses increase by a step size from pulse-to-pulse. In one embodiment, the NAND string in the inner sub-block and the NAND string in the outer sub-block are connected to a same bit line (see FIG. 4H) while in other embodiments they are connected to different bit lines. In one example implementation, the plurality of erase voltage pulses are applied to bit lines connected to all NAND strings of a block including all NAND strings in inner sub-blocks (e.g., sub-bocks 522, 524 and 526) and all NAND strings in outer sub-blocks (e.g., sub-bocks 520 and 528).

Step 804 includes applying a gate voltage to the first transistor to enable GIDL generation for the first group of non-volatile memory cells and applying a gate voltage to the second transistor to enable GIDL generation for the second group of non-volatile memory cells while applying the dose of the memory operation voltage to change threshold voltages of the first group of non-volatile memory cells and the second group of non-volatile memory cells. For example, an appropriate voltage is applied to the gates of SGDT transistors (e.g., SGDT0 and SGDT1) to all NAND strings of a block including all NAND strings in inner sub-blocks (e.g., sub-bocks 522, 524 and 526) and all NAND strings in outer sub-blocks (e.g., sub-bocks 520 and 528) in order to enable GIDL generation. Step 806 includes, after starting to apply the dose of the memory operation voltage and while still applying the dose of the memory operation voltage, changing the gate voltage to the first transistor to change GIDL generation for the first group of non-volatile memory cells. For example, the gate voltage of SGDT transistors (e.g., SGDT0 and SGDT1) to all NAND strings in inner sub-blocks (e.g., sub-bocks 522, 524 and 526) is increased to dampen GIDL generation. In one embodiment where the memory operation is an erase operation, the changing the gate voltage to the first transistor to change GIDL generation for the first group of non-volatile memory cells causes the first group of non-volatile memory cells to become fully erased in a similar time as the second group of non-volatile memory cells.

In one embodiment of FIG. 11, the first group of non-volatile memory cells changes threshold voltages faster than the second group of non-volatile memory cells; and the changing the gate voltage to the first transistor to change GIDL generation for the first group of non-volatile memory cells dampens GIDL generation for the first group of non-volatile memory cells.

In one embodiment of FIG. 11, the first group of non-volatile memory cells changes threshold voltages faster than the second group of non-volatile memory cells; and the changing the gate voltage to the first transistor to change GIDL generation for the first group of non-volatile memory cells comprises increasing the gate voltage of the first transistor to dampen GIDL generation for the first group of non-volatile memory cells during the dose of the memory operation voltage.

In one embodiment, the first group of non-volatile memory cells is a first vertical NAND string; the second group of non-volatile memory cells is a second vertical NAND string; the GIDL generation for the first group of non-volatile memory cells generates holes in a channel region for the first vertical NAND string; the GIDL generation for the second group of non-volatile memory cells generates holes in a channel region for the second vertical NAND string; and the changing the gate voltage to the first transistor to change GIDL generation for the first group of non-volatile memory cells dampens hole generation in the channel region for the first vertical NAND string.

For purposes of this document, the terms damp, damping and dampen refer to the act of reducing or stopping. For example, damping GIDL generation refers to reducing GIDL generation or stopping GIDL generation, and damping hole generation refers to reducing hole generation or stopping hole generation, and damping erase refers to reducing the speed of erase or stopping erase.

Figure 12:
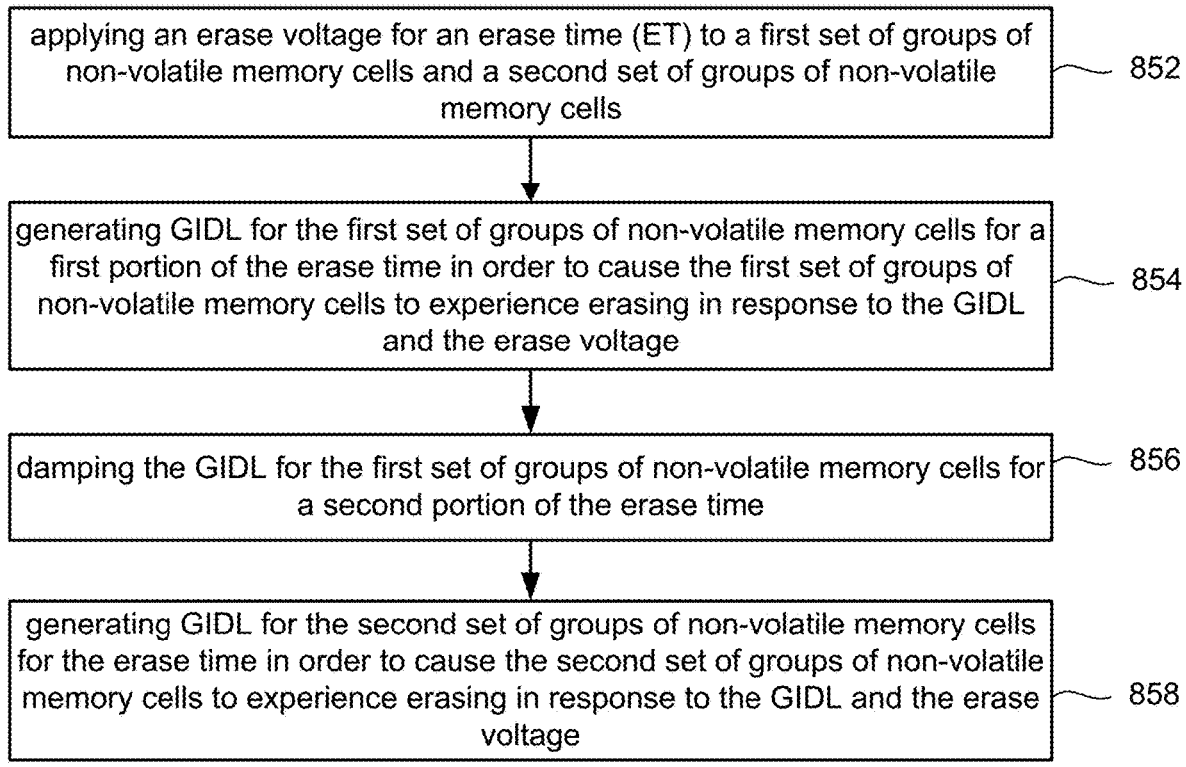
FIG. 12 is a flow chart describing one embodiment of a process for performing a memory operation that includes adjusting the speed of the memory operation for a subset of memory cells by adjusting GIDL during the memory operation.

FIG. 12 is a flow chart describing one embodiment of a process for performing a memory operation that includes adjusting the speed of the memory operation for a subset of memory cells by adjusting GIDL during the memory operation. The process of FIG. 12 can be performed by any of the one or more control circuits discussed above. For example, the process of FIG. 12 can be performed by or at the direction of memory controller 120 and/or state machine 262 (and/or another processor). In the process of FIG. 12, the memory operation being performed is a GIDL-based an erase operation. Step 852 of FIG. 12 includes applying an erase voltage for an erase time ET to a first set of groups of non-volatile memory cells and a second set of groups of non-volatile memory cells. In one example implementation, the first set of groups of non-volatile memory cells comprises a first set of sub-blocks, the second set of groups of non-volatile memory cells comprises a second set of sub-blocks, the erase voltage is an erase voltage pulse and the erase time ET is the pulse width of the erase voltage pulse.

Step 854 of FIG. 12 includes generating GIDL for the first set of groups of non-volatile memory cells for a first portion of the erase time in order to cause the first set of groups of non-volatile memory cells to experience erasing in response to the GIDL and the erase voltage. Step 856 of FIG. 12 comprises damping the GIDL for the first set of groups of non-volatile memory cells for a second portion of the erase time. Step 858 of FIG. 12 comprises generating GIDL for the second set of groups of non-volatile memory cells for the entire erase time in order to cause the second set of groups of non-volatile memory cells to experience erasing in response to the GIDL and the erase voltage. So, in one embodiment, the second set of groups of non-volatile memory cells experience full GIDL and full erasing during the entire pulse width of an erase voltage pulse while the first set of groups of non-volatile memory cells experience full GIDL and full erasing during a portion of the pulse width of an erase voltage pulse and dampened GIDL (and dampened erasing) during the remainder of the erase voltage pulse.

In one example implementation, the erase voltage is a voltage pulse; the generating GIDL for the second set of groups of non-volatile memory cells comprises generating holes in channels for the second set of groups of non-volatile memory; the generating GIDL for the first set of groups of non-volatile memory cells comprises generating holes in channels for the first set of groups of non-volatile memory during a first portion of the voltage pulse; the damping the GIDL for the first set of groups of non-volatile memory cells comprises damping generation of holes in channels for the first set of groups of non-volatile memory during a second portion of the voltage pulse after the first portion of the voltage pulse; and the damping the GIDL for the first set of groups of non-volatile memory cells dampens erasing of the first set of groups of non-volatile memory cells.

In one example implementation, the first set of groups of non-volatile memory cells and the second set of groups of non-volatile memory cells are vertical NAND strings; the applying the erase voltage to the first set of groups of non-volatile memory cells and the second set of groups of non-volatile memory cells comprises applying an erase voltage pulse to bit lines and source lines connected to the vertical NAND strings; the second portion of the erase time is after the first portion of the erase time; and the erase time is the duration of the erase voltage pulse.

In one example implementation, the method further comprises: applying an initial erase voltage pulse to the first set of groups of non-volatile memory cells and the second set of groups of non-volatile memory cells; generating GIDL for the first set of groups of non-volatile memory cells and for the second set of groups of non-volatile memory cells while applying the initial erase voltage pulse; sensing threshold voltage information for the first set of groups of non-volatile memory cells and for the second set of groups of non-volatile memory cells after the initial erase voltage pulse; and automatically determining that the first set of groups of non-volatile memory cells erase faster than the second set of groups of non-volatile memory cells based on the sensing threshold voltage information, the damping is performed in response to determining that the first set of groups of non-volatile memory cells erase faster than the second set of groups of non-volatile memory cells.

In one example implementation, the method further comprises: automatically determining that the first set of groups of non-volatile memory cells erases faster than the second set of groups of non-volatile memory cells; detecting an erase speed difference between the first set of groups of non-volatile memory cells and the second set of groups of non-volatile memory cells; and adaptively setting a damping period for the first set of groups of non-volatile memory cells based on the detected erase speed difference, the second portion of the erase time is the damping period.

In one example discussed above, NAND strings in inner sub-blocks erase faster than NAND strings in outer sub-blocks; however, in other embodiments, the faster NAND strings may be in the outer sub-blocks or the differentiation between fast and slow memory cells may be different than inner versus outer sub-blocks. In some embodiments, identification of which memory cells are fast and which memory cells are slow is known in advance. In other embodiments, the system will automatically and dynamically determine in real time which memory cells are fast and which memory cells are slow.

Figure 13:
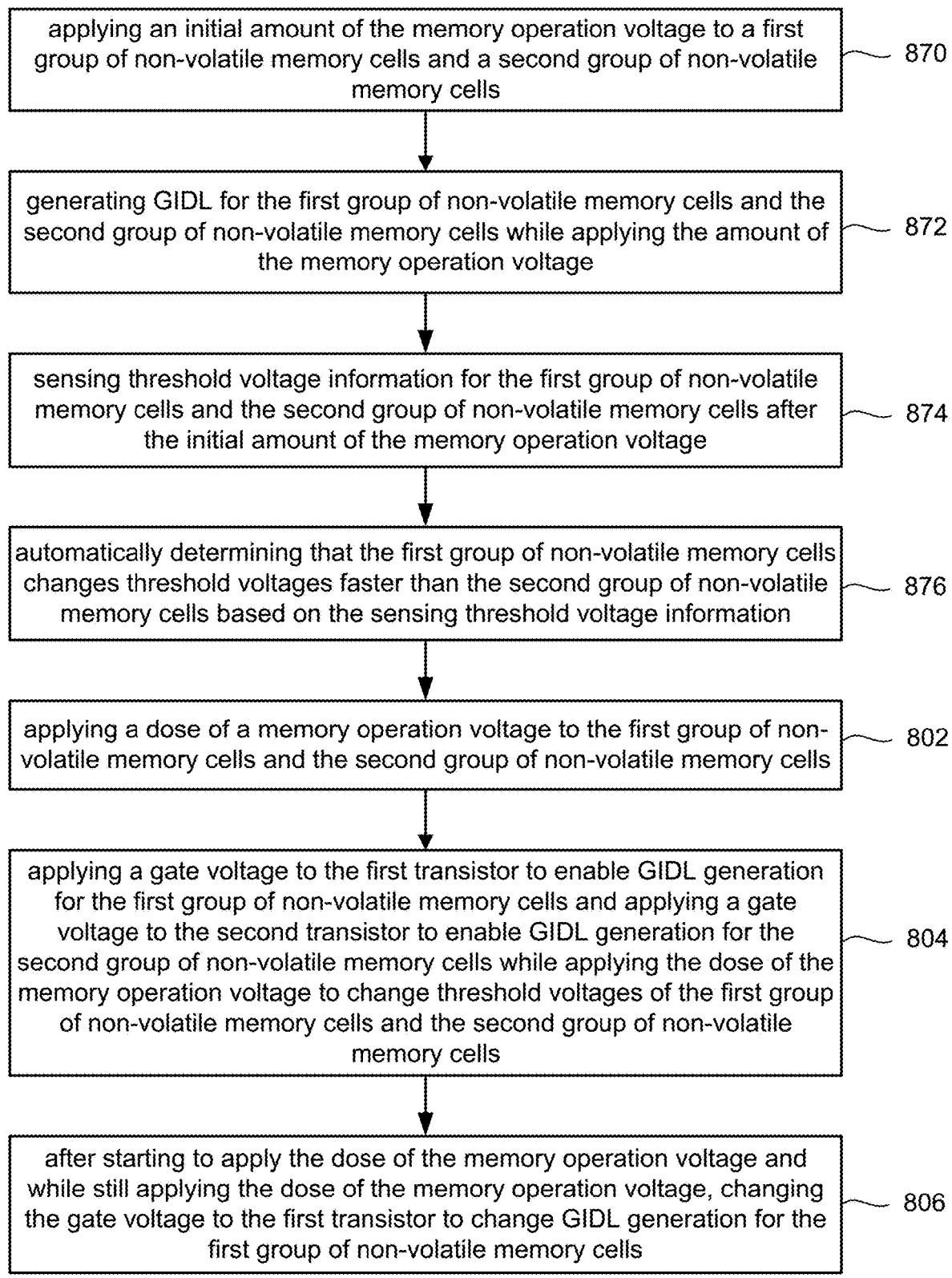
FIG. 13 i is a flow chart describing one embodiment of a process for performing a memory operation that includes adjusting the speed of the memory operation for a subset of memory cells by adjusting GIDL during the memory operation.

FIG. 13 is a flow chart describing one embodiment of a process for performing a memory operation that includes adjusting the speed of the memory operation for a subset of memory cells by adjusting GIDL during the memory operation. The process of FIG. 13 can be performed by any of the one or more control circuits discussed above. For example, the process of FIG. 13 can be performed by or at the direction of memory controller 120 and/or state machine 262 (and/or another processor). The process of FIG. 13 includes automatically and dynamically determining in real time which memory cells are fast and which memory cells are slow. For example, the control circuit can automatically determine that a first group of non-volatile memory cells erases faster than a second group of non-volatile memory cells.

Step 870 of FIG. 13 comprises applying an initial amount of the memory operation voltage to a first group of non-volatile memory cells and a second group of non-volatile memory cells. For example, an erase voltage pulse can be applied to bit lines and a source line connected to a first NAND string (or all NAND strings) of a first sub-block and a second NAND string (or all NAND strings) of a second sub-block. Step 872 comprises generating GIDL for the first group of non-volatile memory cells and the second group of non-volatile memory cells while applying the initial amount of the memory operation voltage. For example, appropriate voltages are applied to the SGDT transistors of the first NAND string (or all NAND strings) of the first sub-block and the second NAND string (or all NAND strings) of the second sub-block during the erase voltage pulse. Step 874 comprises sensing threshold voltage information for the first group of non-volatile memory cells and the second group of non-volatile memory cells after the initial amount of the memory operation voltage. For example, a set of read or sensing operations are performed to generate the threshold voltage distributions (e.g., threshold voltage distributions 740 and 742 of FIG. 9) for the first group of non-volatile memory cells and the second group of non-volatile memory cells. Step 876 comprises automatically determining that the first group of non-volatile memory cells changes threshold voltages faster than the second group of non-volatile memory cells based on the sensing threshold voltage information. That is, in one example embodiment, the group of memory cells detected to have the lower threshold voltage distribution is considered to be the faster erasing group. After step 876, the system performs step 802, 804 and 806 as described above. The changing of the gate voltage to the first transistor in step 806 to change GIDL generation for the first group of non-volatile memory cells includes damping GIDL generation for the first group of non-volatile memory cells in response to determining that the first group of non-volatile memory cells changes threshold voltages faster than the second group of non-volatile memory cells.

Figure 14:
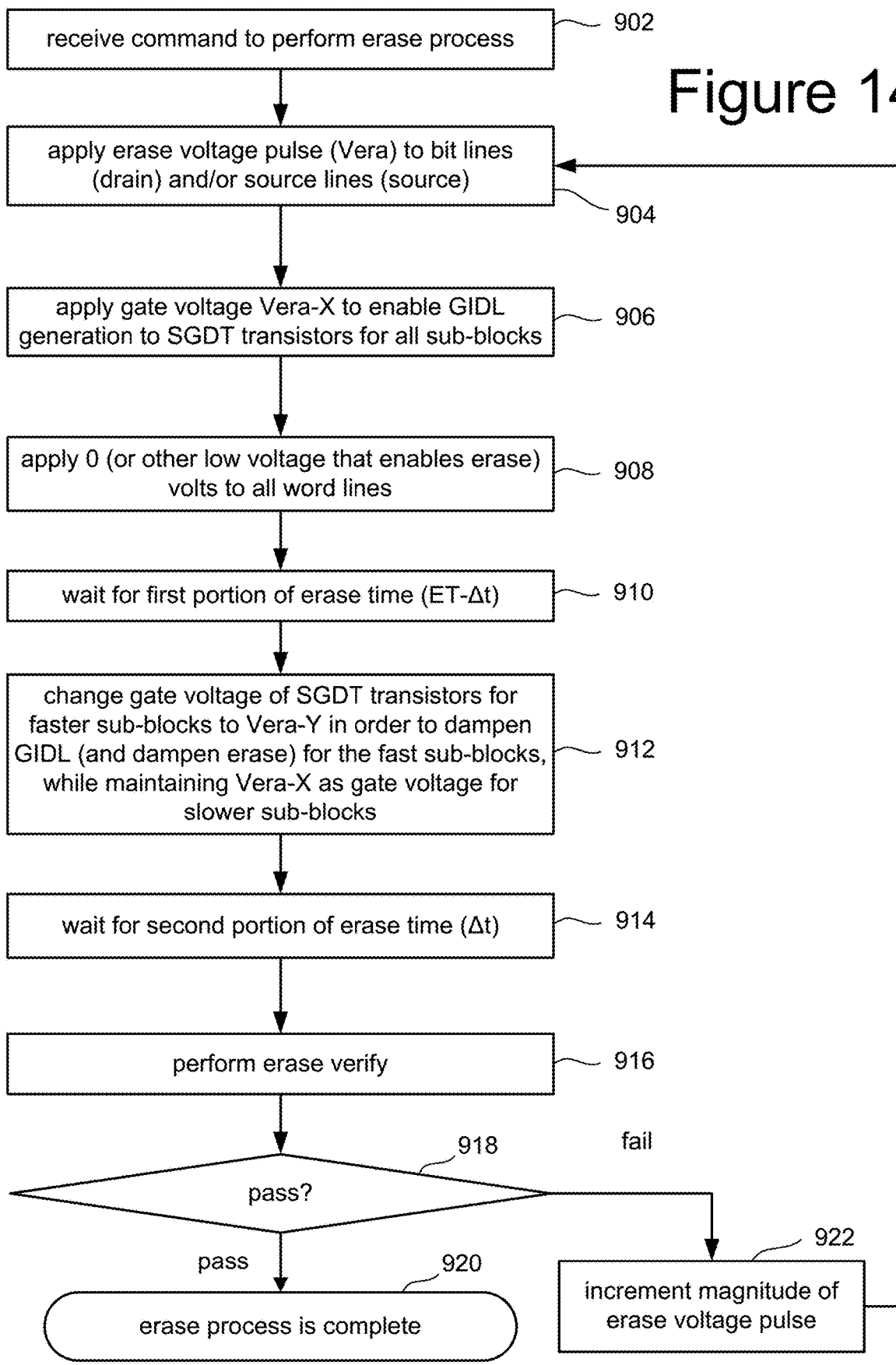
FIG. 14 is a flow chart describing one embodiment of a process for performing a memory operation that includes adjusting the speed of the memory operation for a subset of memory cells by adjusting GIDL during the memory operation.

FIG. 14 is a flow chart describing one embodiment of a process for performing a memory operation that includes adjusting the speed of the memory operation for a subset of memory cells by adjusting GIDL during the memory operation. The process of FIG. 14 can be performed by any of the one or more control circuits discussed above. For example, the process of FIG. 14 can be performed by or at the direction of memory controller 120 and/or state machine 262 (and/or another processor). In the process of FIG. 14, the memory operation being performed is a GIDL-based an erase operation. The process of FIG. 14 is an example implementation of the processes of FIGS. 11 and 12.

In step 902 of FIG. 14, the control circuit receives a command to perform an erase process. For example, a request to erase can be received from the host, from the memory controller or otherwise generated internal to the memory die. In step 904, the control circuit applies an erase voltage pulse (Vera) to the bit lines (drain) and/or source lines (source) for all NAND strings of a block. In one embodiment, the erase voltage Vera is an electrical signal that includes a plurality of voltage pulses. In one embodiment, the magnitude of the first Vera voltage pulse is ~18 volts. Each successive voltage pulse has an increase in magnitude by a constant step size. Examples of a step size include 0.2-0.6 volts. Step 904 corresponds to step 802 of FIG. 11 and step 852 of FIG. 12. In step 906 of FIG. 14, the control circuit applies a gate voltage to the SGDT transistors for all NAND strings of all sub-blocks. This gate voltage will enable GIDL generation at the SGFT transistors, as discussed above. One example, the gate voltage is equal to Vera-X. In one example implementation, X=10 volts; therefore, the voltage applied to the gates of the SGDT transistors is 10 volts less than the magnitude of the erase voltage pulse applied in step 904. In step 908, the control circuit applies zero volts or another low voltage that enables erase (e.g. 0.5 volts) to all data word lines and dummy word lines.

In step 910, the control circuit waits for a first portion of the erase time ET. In one embodiment the erase time is the pulse width of the erase voltage pulse applied in step 904. An example pulse width is 1,000 us. In one embodiment the first portion of the erase time is equal to ET-Δt, where ET is equal to the erase time and Δt is damping period. In one example, Δt=200 us. In one embodiment, steps 906-910 of FIG. 14 correspond to step 804 of FIG. 11 and step 854 of FIG. 12. In step 912 of FIG. 14, the control circuit changes the gate voltage of the SGDT transistors for the faster sub-blocks from Vera-X to Vera-Y in order to dampen GIDL (and dampen erase) for the faster sub-blocks while maintaining Vera-X as the gate voltage of the SGDT transistors for slower sub-blocks. One example of Y is five volts. Therefore, part way through the erase voltage pulse, those NAND strings that are in the sub-block considered fast erasing will have their gate voltage of the SGDT transistors increased to five volts less than the magnitude of the erase voltage pulse. This increasing of the gate voltage of the SDT transistors will slow down or stop GIDL (and slow down or stop erasing). In one embodiment, the gate voltage for the SGDT transistors are raised for the inner sub-blocks and not for the outer sub-blocks (as discussed above). In step 914 of FIG. 14, the control circuit waits for a second portion of the erase time. This waiting will be for the Δt, the damping period. Thus, the first portion of the erase time is equal to ET-Δt and the second portion of the erase time is equal to Δt. That is, the erase voltage pulse is divided into two portions a first portion and a second portion. Steps 912 and 914 of FIG. 14 correspond to step 806 of FIG. 11 and 856 of FIG. 12. Steps 906-914 of FIG. 14 correspond to step 858 of FIG. 12.

In step 916 of FIG. 14, the control circuit performs erase verify. For example, looking back at FIG. 5, the control circuit tests whether the memory cells have threshold voltages below Ev (e.g., whether the memory cells are in erase state S0). In one embodiment, the verification is performed by applying the voltage Ev to the gates of all the memory cells and seeing whether they conduct. Those memory cells that conduct have a threshold voltage below Ev. If all of the memory cells being verified pass the erase verify test (that is their threshold voltage is less than Ev) in step 918, then the erase process is complete (step 920). If not all of the memory cells pass the erase verify test (step 918), then one or more memory cells have failed and the process continues to step 922. In one embodiment, if one NAND string or one memory cell of one NAND string fails erase verify then the process will continue with step 922. In another embodiment, the system will allow a predefined number of memory cells to fail and still consider the erase verify as a pass because error correction codes can fix a certain number of errors. If one or more memory cells (or one or more NAND strings) fail erase verify (step 918), then in step 922 the magnitude of the erase voltage pulse will be incremented by the step size and the process will continue with step 904 for another iteration of the erase process. Each iteration of the erase process can be referred to as an erase operation.

Figure 15:
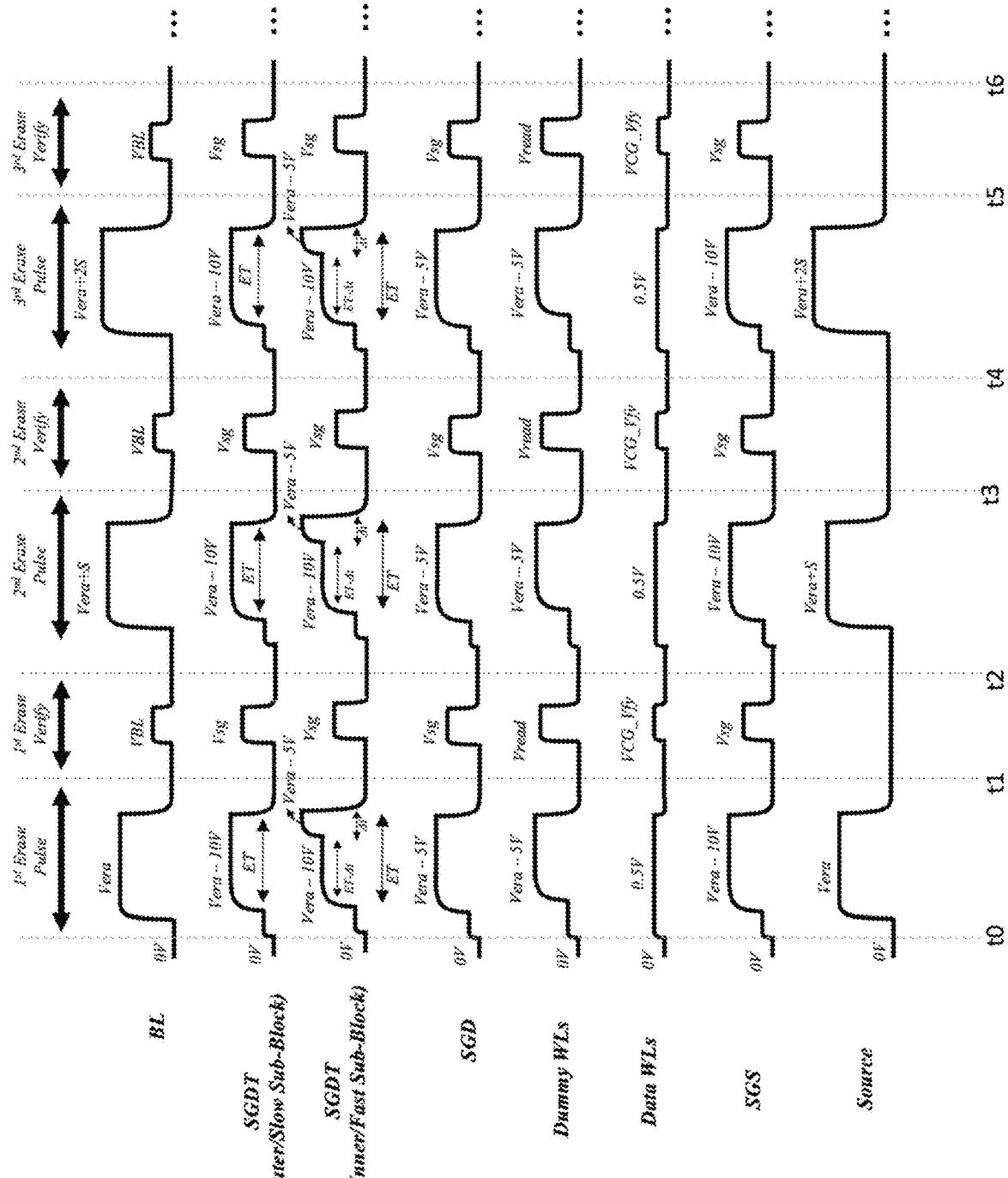
FIG. 15 is a timing diagram describing one embodiment of a process for performing a memory operation that includes adjusting the speed of the memory operation for a subset of memory cells by adjusting GIDL during the memory operation.

FIG. 15 is a timing diagram describing one embodiment of a process of performing a memory operation that includes adjusting the speed of the memory operation for a subset of memory cells by adjusting GIDL during the memory operation. FIG. 15 is an example implementation of the processes of FIGS. 11, 12, 13 and/or 14. The process depicted in FIG. 15 is an erase operation.

FIG. 15 depicts behavior of the following signals: BL, SGDT (outer/slow sub-block), SGDT (inner/fast sub-block), SGD, dummy WLs, Data WLs, SGS and Source. The signal BL is the signal applied to all bit lines for the block being erased. The signal SGDT (outer/slow sub-block) is the signal applied to the gate for the SGDT transistor of NAND strings in the sub-blocks that are outer sub-blocks or sub-blocks that are determined to be slow sub-blocks. The signal SGDT (inner/fast sub-blocks) is the signal applied to the gates of the SGDT transistors of NAND strings in the inner sub-blocks or sub-blocks that are determined to be fast sub-blocks. The signal SGD is the signal applied to the gates of the SGD transistors for all NAND strings of the block. The signal SGS is the signal applied to the gate of the SGS transistors for all NAND strings of the block. The signal Source is the signal applied to the source line for the block. The signal Dummy WLs is the signal applied to the dummy word lines for the block, which connects to the control gates for all dummy memory cells. The signal Data WLs is the signal applied to all data word lines for all NAND strings of the block. The data word lines are connected to the control gates of the data memory cells.

Between time t0 and t1, an erase voltage pulse is applied to the bit lines BL. The magnitude of the first erase voltage pulse is Vera. The application of this erase voltage pulse corresponds to steps 802, 852 and 904, as discussed above. Also between times t0 and t1, the gates of the SGDT transistors are raised to an initial voltage and then to Vera-10 volts to facilitate GIDL generation. For those SGDT transistors in the outer or slow sub-blocks, the gate voltage remains at Vera-10 volts for the entire erase time ET. For those SGDT transistors in the inner or fast sub-blocks, the gate voltage would remain at Vera-10 volts for ET-Δt and then the gate voltage is raised to Vera-5V, which dampens GIDL. Maintaining the SGDT transistors gate voltage at Vera-10V for the entire erase time for outer or slow sub-blocks corresponds to steps 804, 858 and 906. For the SGDT transistors that are part of inner or fast sub-blocks, the initial maintaining the gate voltage at Vera-10 volts for ET-Δt corresponds to steps 804, 854, 906 and 910. The raising of the gate voltage for SGDT transistors for the inner or fast sub-blocks to Vera-5 volts corresponds to steps 806, 856 and 912. Also between times t0 and t1, the gate voltage of the SGD transistors are set at Vera-5 volts, Dummy WLs are set at Vera-5vvolts, Data Wls are set at 0.5 volts (corresponding to step 908), SGS transistors have their gate voltage at Vera-10 volts and the source is set at Vera.

Between times t1 and t2, the systems perform erase verification (corresponding to step 916 of FIG. 14). Therefore, a voltage VBL is applied to the bit lines BL. In one embodiment, VBL corresponds to Ev (see FIG. 5). Additionally, a voltage Vsg is applied to the gates of the SGDT transistors, SGD transistors, and SGS transistors. In one embodiment, the voltage Vsg corresponds to ~0.3-0.6v. Additionally, during erase verify, the dummy word lines (Dummy WLs) receive the read Vread (e.g., approximately 10 volts) and the data word lines Data WLs receive VCG_Vfy. In one embodiment, the voltage VCG_Vfy corresponds to 5 volts. The source line remains at ground during erase verify.

During the time periods between t2-t3 and t4-t5, additional erase voltage pulses are applied (with step size S indicating the increase in magnitude of the voltage pulse), corresponding to additional iterations of the erase process (steps 904-922 of FIG. 14). During the time periods between t3-t4 and t5-t6, additional erase verify is performed (step 916). The process depicted in FIG. 15 continue with additional erase voltage pulses and additional erase verify until all or enough memory cells (or NAND strings) pass erase verify (see step 918).

Figure 16A:
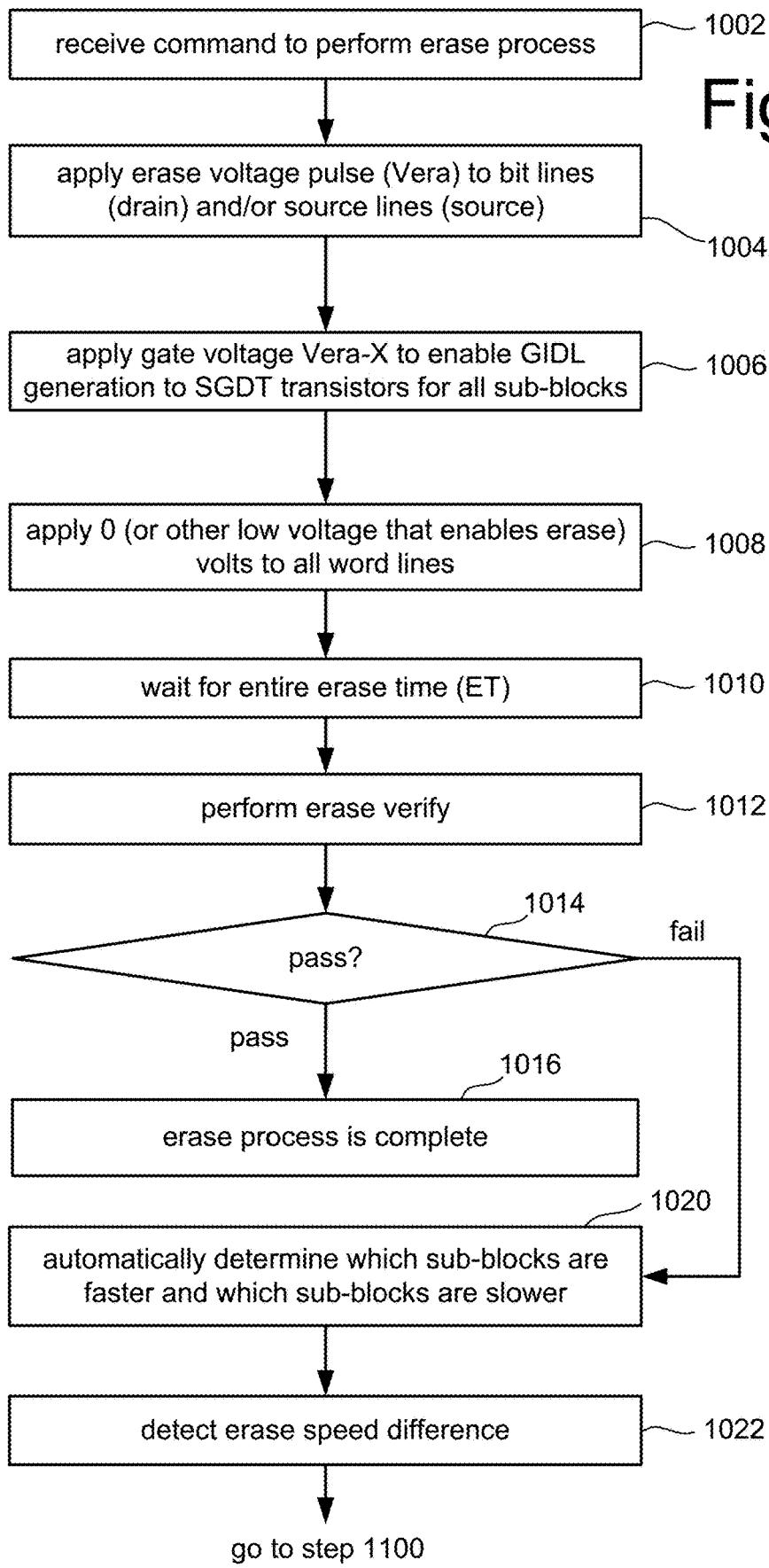
FIGS. 16A and 16B are a flow chart describing one embodiment of a process for performing a memory operation that includes adjusting the speed of the memory operation for a subset of memory cells by adjusting GIDL during the memory operation.
Figure 16B:
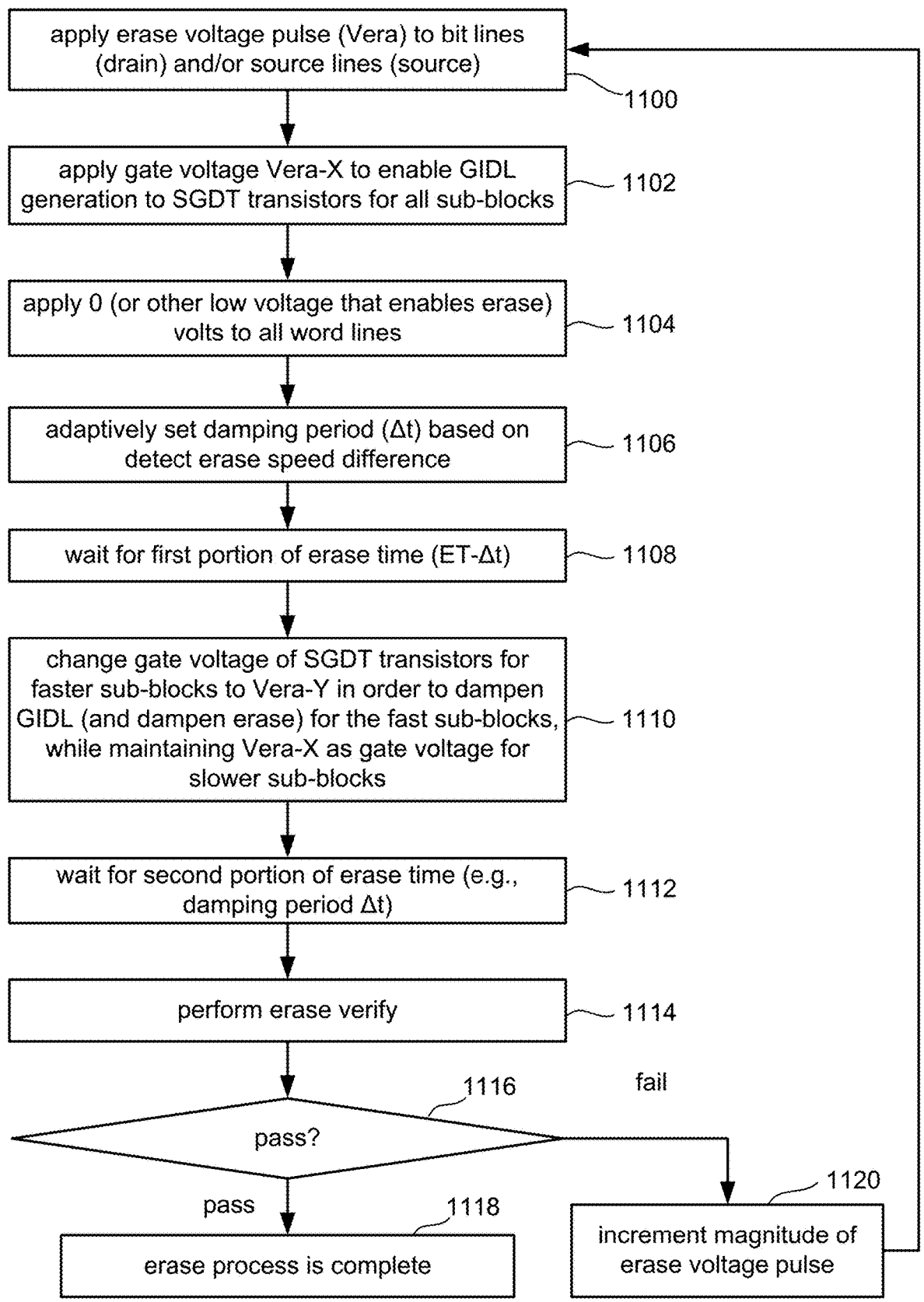

FIGS. 16A and 16B together are a flowchart describing one embodiment of a process for performing a memory operation that includes adjusting the speed of the memory operation for a subset of memory cells by adjusting GIDL during the memory operation. The process of FIGS. 16A/B can be performed by any one of the one or more control circuits discussed above. For example, the process of FIGS. 16A/B can be performed by or at the direction of memory controller 120 and/or state machine 262 (and/or another processor). In the process of FIGS. 16A/B, the memory operation being performed is a GIDL based erase process. The process of FIGS. 16A/B is an example implementation of the processes of FIGS. 11, 12 and/or 13.

In step 1002, the control circuit receives a command to perform an erase process. Step 1002 of FIG. 16A is similar to step 902 of FIG. 14. In step 1004 of FIG. 16A, the control circuit applies an erase voltage pulse (e.g., at a magnitude of Vera, such as ~16v) to bit lines and/or source lines. In step 1006, the control circuit applies a gate voltage equal to Vera-X to SGDT transistors for all NAND strings of all sub-blocks of the block being erased, in order to enable GIDL generation. In step 1008, the system applies zero volts or another low voltage (e.g. 0.5 volts) to all word lines of the block being erased, in order to enable the erase operation. In step 1010, the control circuit wait for the entire erase time (ET). In step 1012, the control circuit perform erase verify. If all memory cells have passed (step 1014), then in step 1016 it is determined that the erase process is complete after only one erase voltage pulse. However, if one or more than a predetermined number of memory cells (or NAND strings) fail the erase process (step 1014) then in step 1020 the control circuit automatically determines which sub-blocks are erasing faster and which sub-blocks are erasing slower. In one embodiment the system will perform sensing or read operations at a plurality of threshold voltages at and below the voltage Ev. That is, the system will perform a number of sensing operations for the various threshold voltages of the threshold voltage distribution for the erased data state S0 to determine how many memory cells (and/or how many NAND strings) are at each threshold voltage. This data can be used to create a histogram for each sub-block. By comparing histograms it is determined which sub-blocks are faster and which sub-blocks are slower as the histograms will be lower in voltage for the faster sub-blocks. Other processes for automatically determining which sub-blocks are erasing faster sub-blocks and which sub-blocks are erasing slower sub-blocks can also be performed. In step 1022, the control circuit automatically detects the erase speed difference between fast erasing sub-blocks and slow erasing sub-blocks. In one embodiment the difference can be determined by the difference in voltage between the middle (or other portions) of the respective histograms. Other methods can also be used. After step 1022, the process continues at step 1100 of FIG. 16B.

In step 1100 of FIG. 16B, the control circuit applies an erase voltage pulse (at a magnitude of Vera or a magnitude of Vera plus a step size S) to all bit lines and all source lines of the block. Step 1100 of FIG. 16B is similar to step 904 of FIG. 14. In step 1102, the control circuit applies a gate voltage of Vera-X to enable GIDL generation to SGDT transistors for all sub-blocks. Step 1102 is similar to step 906 of FIG. 14. In step 1104 of FIG. 16B, the control circuit applies zero volts or another low voltage (e.g. 0.5 volts) to all word lines, in order to enable the erase operation. Step 1104 is similar to step 908. In step 1106, the control circuit adaptively sets the dampening period (Δt) based on the detecting of the difference in erase speed difference from step 1022. Experimentation can be used on each memory design/implementation to determine how much to change Δt based on the different detected speed differences from step 1022.

In step 1108, the control circuit waits for a first portion of the erase time which corresponds to a first portion of the erase voltage pulse ET-Δt. Step 1108 is similar to step 910. In step 1110, the control circuit changes the gate voltage of SGDT transistors for NAND strings in faster sub-blocks to Vera-Y in order to dampen GIDL (and dampen erase) for the faster sub-blocks while maintaining Vera-X as the gate voltage for SGDT transistors for NAND strings in slower sub-blocks. Step 1110 is similar to step 1022. In one embodiment Y is programmable based on the detected speed difference from step 1022. Step 1110 is similar to step 912.

Note that in some embodiments, instead of a NAND string, other groups of memory cells can be used.

In step 1112, the control circuit waits for a second portion of the erase time (e.g. corresponding to the dampening period Δt). Step 1112 is similar to 914. In step 1114, the control circuit performs erase verify. Step 1114 is similar to step 916. If all memory cells (or predefined number of memory cells or predefined number of NAND strings) pass the erase verify (step 1116), then in step 1118 it is determined that the erase process is complete. However, if a predefined number of memory cells or NAND strings fail the erase verify, then in step 1120 the magnitude of the erase voltage pulse will be incremented by the step size S and the process will loop back to step 1100.

A memory system has been disclosed that adjusts the speed of a memory operation for a subset of memory cells. For example, during a GIDL based erase process, the GIDL generation can be dampened for a subset of memory cells (e.g., for a set of NAND strings, or one or more sub-blocks) so that different subsets of memory cells operate at a similar speed.

One embodiment includes an apparatus comprising a control circuit configured to be connected to non-volatile memory cells including a first group of non-volatile memory cells and a second group of non-volatile memory cells. The first group of non-volatile memory cells includes at least a first transistor to create gate induced drain leakage (GIDL) for the first group of non-volatile memory cells. The second group of non-volatile memory cells includes at least a second transistor to create GIDL for the second group of non-volatile memory cells. The control circuit is configured to change threshold voltages of the first group of non-volatile memory cells and the second group of non-volatile memory cells by: applying a dose of a memory operation voltage to the first group of non-volatile memory cells and the second group of non-volatile memory cells; applying a gate voltage to the first transistor to enable GIDL generation for the first group of non-volatile memory cells and applying a gate voltage to the second transistor to enable GIDL generation for the second group of non-volatile memory cells while applying the dose of the memory operation voltage to change threshold voltages of the first group of non-volatile memory cells and the second group of non-volatile memory cells; and after starting to apply the dose of the memory operation voltage and while still applying the dose of the memory operation voltage, changing the gate voltage to the first transistor to change GIDL generation for the first group of non-volatile memory cells.

In one example implementation, the GIDL generation for the first group of non-volatile memory cells generates holes in a channel region for the first vertical NAND string; the GIDL generation for the second group of non-volatile memory cells generates holes in a channel region for the second vertical NAND string; and the changing the gate voltage to the first transistor to change GIDL generation for the first group of non-volatile memory cells dampens hole generation in the channel region for the first vertical NAND string.

In one example implementation, the first group of non-volatile memory cells is a first vertical NAND string with a charge trapping region; the second group of non-volatile memory cells is a second vertical NAND strings with a charge trapping region; the first transistor is positioned at a drain side of the first vertical NAND string; the second transistor is positioned at a drain side of the second vertical NAND string; the GIDL generation for the first group of non-volatile memory cells generates holes in a channel region for the first vertical NAND string; the GIDL generation for the second group of non-volatile memory cells generates holes in a channel region for the second vertical NAND string; the changing threshold voltages of the first group of non-volatile memory cells and the second group of non-volatile memory cells comprises the holes generated in the channel region for the first vertical NAND string combining with electrons in the charge trapping region of the first vertical NAND string and the holes generated in the channel region for the second vertical NAND string combining with electrons in the charge trapping region of the second vertical NAND string; and the changing the gate voltage to the first transistor to change GIDL generation for the first group of non-volatile memory cells dampens hole generation in the channel region for the first vertical NAND string.

One embodiment includes a method comprising applying an erase voltage for an erase time to a first set of groups of non-volatile memory cells and a second set of groups of non-volatile memory cells; generating gate induced drain leakage (GIDL) for the first set of groups of non-volatile memory cells for a first portion of the erase time in order to cause the first set of groups of non-volatile memory cells to experience erasing in response to the GIDL and the erase voltage; damping the GIDL for the first set of groups of non-volatile memory cells for a second portion of the erase time; and generating GIDL for the second set of groups of non-volatile memory cells for the erase time in order to cause the second set of groups of non-volatile memory cells to experience erasing in response to the GIDL and the erase voltage.

One embodiment includes an apparatus comprising a control circuit connected to non-volatile memory that includes a first set of vertical NAND strings and a second set of vertical NAND strings. The non-volatile memory further includes a set of word lines such that each word line of the set of word lines is connected to both of the first set of vertical NAND strings and the second set of vertical NAND strings. The non-volatile memory further includes a set of bit lines connected to the first set of vertical NAND strings and the second set of vertical NAND strings. The control circuit is configured to erase the a first set of vertical NAND strings and the second set of vertical NAND strings by: applying a series of erase voltage pulses to the bit lines, generating holes in the first set of vertical NAND strings and the second set of vertical NAND strings using gate induced drain leakage (GIDL) during the erase voltage pulses and, for each erase voltage pulse of at least a subset of the erase voltage pulses, damping the generating of holes using GIDL for the first set of vertical NAND strings during only a portion of the erase voltage pulse to slow down erasing of the first set of vertical NAND strings as compared to the second set of vertical NAND strings.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
    a control circuit configured to be connected to non-volatile memory cells including a first group of non-volatile memory cells and a second group of non-volatile memory cells, the first group of non-volatile memory cells includes at least a first transistor to create gate induced drain leakage (GIDL) for the first group of non-volatile memory cells, the second group of non-volatile memory cells includes at least a second transistor to create GIDL for the second group of non-volatile memory cells, the control circuit is configured to change threshold voltages of the first group of non-volatile memory cells and the second group of non-volatile memory cells by:
        applying a dose of a memory operation voltage to the first group of non-volatile memory cells and the second group of non-volatile memory cells;
        applying a gate voltage to the first transistor to enable GIDL generation for the first group of non-volatile memory cells and applying a gate voltage to the second transistor to enable GIDL generation for the second group of non-volatile memory cells while applying the dose of the memory operation voltage to change threshold voltages of the first group of non-volatile memory cells and the second group of non-volatile memory cells; and
        after starting to apply the dose of the memory operation voltage and while still applying the dose of the memory operation voltage, changing the gate voltage to the first transistor to change GIDL generation for the first group of non-volatile memory cells.

2. The apparatus of claim 1, wherein:
    the first group of non-volatile memory cells changes threshold voltages faster than the second group of non-volatile memory cells; and
    the changing the gate voltage to the first transistor to change GIDL generation for the first group of non-volatile memory cells dampens GIDL generation for the first group of non-volatile memory cells.

3. The apparatus of claim 1, wherein:
    the first group of non-volatile memory cells changes threshold voltages faster than the second group of non-volatile memory cells; and the changing the gate voltage to the first transistor to change GIDL generation for the first group of non-volatile memory cells comprises increasing the gate voltage of the first transistor to dampen GIDL generation for the first group of non-volatile memory cells during the dose of the memory operation voltage.

4. The apparatus of claim 1, wherein:
the first group of non-volatile memory cells is a first vertical NAND string;
the second group of non-volatile memory cells is a second vertical NAND string;
the GIDL generation for the first group of non-volatile memory cells generates holes in a channel region for the first vertical NAND string;
the GIDL generation for the second group of non-volatile memory cells generates holes in a channel region for the second vertical NAND string; and
the changing the gate voltage to the first transistor to change GIDL generation for the first group of non-volatile memory cells dampens hole generation in the channel region for the first vertical NAND string.

5. The apparatus of claim 1, wherein:
the dose of the memory operation voltage is an erase voltage pulse;
the first group of non-volatile memory cells erases faster than the second group of non-volatile memory cells;
the applying the gate voltage to the first transistor to enable GIDL generation for the first group of non-volatile memory cells and the applying the gate voltage to the second transistor to enable GIDL generation for the second group of non-volatile memory cells while applying the dose of the memory operation voltage causes the first group of non-volatile memory cells and the second group of non-volatile memory cells to experience an erase operation; and
the changing the gate voltage to the first transistor to change GIDL generation for the first group of non-volatile memory cells comprises increasing the gate voltage of the first transistor during the erase voltage pulse.

6. The apparatus of claim 5, wherein:
the control circuit is further configured to automatically determine that the first group of non-volatile memory cells erases faster than the second group of non-volatile memory cells.

7. The apparatus of claim 1, wherein the control circuit is further configured to:
apply an initial amount of the memory operation voltage to the first group of non-volatile memory cells and the second group of non-volatile memory cells;
generate GIDL for the first group of non-volatile memory cells and the second group of non-volatile memory cells while applying the initial amount of the memory operation voltage;
sense threshold voltage information for the first group of non-volatile memory cells and the second group of non-volatile memory cells after the initial amount of the memory operation voltage; and
automatically determine that the first group of non-volatile memory cells changes threshold voltages faster than the second group of non-volatile memory cells based on the sensing threshold voltage information, the changing the gate voltage to the first transistor to change GIDL generation for the first group of non-volatile memory cells dampens GIDL generation for the first group of non-volatile memory cells.

8. The apparatus of claim 7, wherein:
the generating GIDL for the first group of non-volatile memory cells and the second group of non-volatile memory cells while applying the initial amount of the memory operation voltage comprises applying a same gate voltage to the first transistor and the second transistor to enable GIDL generation for the first group of non-volatile memory cells and the second group of non-volatile memory cells.

9. The apparatus of claim 1, wherein the memory operation is an erase operation, and the control circuit is further configured to:
automatically determine that the first group of non-volatile memory cells erases faster than the second group of non-volatile memory cells;
detect an erase speed difference between the first group of non-volatile memory cells and the second group of non-volatile memory cells; and
adaptively set a damping period based on the detected erase speed difference, the control circuit is configured to perform the changing the gate voltage to the first transistor to dampen GIDL generation for the first group of non-volatile memory cells for the damping period while applying the dose of the memory operation voltage.

10. The apparatus of claim 1, wherein:
the memory operation is an erase operation;
the changing threshold voltages of the first group of non-volatile memory cells and the second group of non-volatile memory cells is for the erase operation;
the first group of non-volatile memory cells erases faster than the second group of non-volatile memory cells; and
the changing the gate voltage to the first transistor to change GIDL generation for the first group of non-volatile memory dampens erasing for the first group of non-volatile memory cells during the dose of the memory operation voltage.

11. The apparatus of claim 1, wherein:
the dose of the memory operation voltage is a voltage pulse;
the applying the gate voltage to the first transistor enables GIDL generation for the first group of non-volatile memory cells during a first portion of the voltage pulse; and
the changing the gate voltage to the first transistor to change GIDL generation for the first group of non-volatile memory cells stops GIDL generation for the first group of non-volatile memory cells for a second portion of the voltage pulse, the second portion of the voltage pulse occurs after the first portion of the voltage pulse.

12. The apparatus of claim 1, wherein:
the dose of the memory operation voltage is one erase voltage pulse of a plurality of erase voltage pulses that increase in magnitude from pulse to pulse; and
the applying the gate voltage to the first transistor to enable GIDL generation for the first group of non-volatile memory cells and applying the gate voltage to the second transistor to enable GIDL generation for the second group of non-volatile memory cells while applying the dose of the memory operation voltage causes the first group of non-volatile memory cells and the second group of non-volatile memory cells to experience erasing.

13. The apparatus of claim 12, wherein:
the changing the gate voltage to the first transistor to change GIDL generation for the first group of non-volatile memory cells causes the first group of non-volatile memory cells to become fully erased in a similar time as the second group of non-volatile memory cells.

14. The apparatus of claim 1, wherein:
the first group of non-volatile memory cells is a first vertical NAND string with a charge trapping region;
the second group of non-volatile memory cells is a second vertical NAND strings with a charge trapping region;
the first transistor is positioned at a drain side of the first vertical NAND string;
the second transistor is positioned at a drain side of the second vertical NAND string;
the GIDL generation for the first group of non-volatile memory cells generates holes in a channel region for the first vertical NAND string;
the GIDL generation for the second group of non-volatile memory cells generates holes in a channel region for the second vertical NAND string;
the changing threshold voltages of the first group of non-volatile memory cells and the second group of non-volatile memory cells comprises the holes generated in the channel region for the first vertical NAND string combining with electrons in the charge trapping region of the first vertical NAND string and the holes generated in the channel region for the second vertical NAND string combining with electrons in the charge trapping region of the second vertical NAND string; and
the changing the gate voltage to the first transistor to change GIDL generation for the first group of non-volatile memory cells dampens hole generation in the channel region for the first vertical NAND string.

15. A method comprising:
applying an erase voltage for an erase time to a first set of groups of non-volatile memory cells and a second set of groups of non-volatile memory cells;
generating gate induced drain leakage (GIDL) for the first set of groups of non-volatile memory cells for a first portion of the erase time in order to cause the first set of groups of non-volatile memory cells to experience erasing in response to the GIDL and the erase voltage;
damping the GIDL for the first set of groups of non-volatile memory cells for a second portion of the erase time; and
generating GIDL for the second set of groups of non-volatile memory cells for the erase time in order to cause the second set of groups of non-volatile memory cells to experience erasing in response to the GIDL and the erase voltage.

16. The method of claim 15, wherein:
the erase voltage is a voltage pulse;
the generating GIDL for the second set of groups of non-volatile memory cells comprises generating holes in channels for the second set of groups of non-volatile memory;
the generating GIDL for the first set of groups of non-volatile memory cells comprises generating holes in channels for the first set of groups of non-volatile memory during a first portion of the voltage pulse;
the damping the GIDL for the first set of groups of non-volatile memory cells comprises damping generation of holes in channels for the first set of groups of non-volatile memory during a second portion of the voltage pulse after the first portion of the voltage pulse; and the damping the GIDL for the first set of groups of non-volatile memory cells dampens erasing of the first set of groups of non-volatile memory cells.

17. The method of claim 15, wherein:
the first set of groups of non-volatile memory cells and the second set of groups of non-volatile memory cells are vertical NAND strings;
the applying the erase voltage to the first set of groups of non-volatile memory cells and the second set of groups of non-volatile memory cells comprises applying an erase voltage pulse to bit lines and source lines connected to the vertical NAND strings;
the second portion of the erase time is after the first portion of the erase time; and
the erase time is the duration of the erase voltage pulse.

18. The method of claim 15, further comprising:
applying an initial erase voltage pulse to the first set of groups of non-volatile memory cells and the second set of groups of non-volatile memory cells;
generating GIDL for the first set of groups of non-volatile memory cells and for the second set of groups of non-volatile memory cells while applying the initial erase voltage pulse;
sensing threshold voltage information for the first set of groups of non-volatile memory cells and for the second set of groups of non-volatile memory cells after the initial erase voltage pulse; and
automatically determining that the first set of groups of non-volatile memory cells erase faster than the second set of groups of non-volatile memory cells based on the sensing threshold voltage information, the damping is performed in response to determining that the first set of groups of non-volatile memory cells erase faster than the second set of groups of non-volatile memory cells.

19. The method of claim 15, further comprising:
automatically determining that the first set of groups of non-volatile memory cells erases faster than the second set of groups of non-volatile memory cells;
detecting an erase speed difference between the first set of groups of non-volatile memory cells and the second set of groups of non-volatile memory cells; and
adaptively setting a damping period for the first set of groups of non-volatile memory cells based on the detected erase speed difference, the second portion of the erase time is the damping period.

20. An apparatus, comprising:
non-volatile memory including a first set of vertical NAND strings and a second set of vertical NAND strings, the non-volatile memory further includes a set of word lines such that each word line of the set of word lines is connected to both of the first set of vertical NAND strings and the second set of vertical NAND strings, the non-volatile memory further includes a set of bit lines connected to the first set of vertical NAND strings and the second set of vertical NAND strings; and
a control circuit connected to the non-volatile memory, the control circuit is configured to erase the a first set of vertical NAND strings and the second set of vertical NAND strings by:
applying a series of erase voltage pulses to the bit lines,
generating holes in the first set of vertical NAND strings and the second set of vertical NAND strings using gate induced drain leakage (GIDL) during the erase voltage pulses, and
for each erase voltage pulse of at least a subset of the erase voltage pulses, damping the generating of holes using GIDL for the first set of vertical NAND strings during only a portion of the erase voltage pulse to slow down erasing of the first set of vertical NAND strings as compared to the second set of vertical NAND strings.

* * * * *